(12) United States Patent
Goma et al.

(10) Patent No.: US 10,191,119 B2
(45) Date of Patent: Jan. 29, 2019

(54) INSPECTING APPARATUS AND INSPECTING METHOD FOR NONCONTACT POWER TRANSFER SYSTEM

(71) Applicant: Murata Manufacturing Co., Ltd., Nagaokakyo-shi, Kyoto-fu (JP)

(72) Inventors: Shinji Goma, Nagaokakyo (JP); Kazuya Kato, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 631 days.

(21) Appl. No.: 14/858,136

(22) Filed: Sep. 18, 2015

(65) Prior Publication Data
US 2016/0011276 A1   Jan. 14, 2016

Related U.S. Application Data

(63) Continuation of application No. PCT/JP2014/063712, filed on May 23, 2014.

(30) Foreign Application Priority Data

Jun. 6, 2013   (JP) ................. 2013-119817
Oct. 31, 2013   (JP) ................. 2013-227227

(51) Int. Cl.
   *G01R 31/40*   (2014.01)
   *H02J 50/05*   (2016.01)
   (Continued)

(52) U.S. Cl.
   CPC ............ *G01R 31/40* (2013.01); *G01R 31/00* (2013.01); *G01R 31/04* (2013.01); *G01R 31/44* (2013.01);
   (Continued)

(58) Field of Classification Search
   CPC .. H02J 7/025; H02J 50/05; H02J 50/12; H02J 5/005; H02J 17/00; H02J 50/00;
   (Continued)

(56) References Cited

U.S. PATENT DOCUMENTS 9,735,589 B2 *   8/2017   Goma ................. H02J 5/005
2012/0299392 A1   11/2012   Ichikawa et al.
(Continued)

FOREIGN PATENT DOCUMENTS

EP   2 903 132 A1   5/2015
JP   H06-133476 A   5/1994
(Continued)

OTHER PUBLICATIONS

International Search Report issued for PCT/JP2014/063712, dated Jul. 8, 2014.
Written Opinion of the International Searching Authority issued for PCT/JP2014/063712, dated Jul. 8, 2014.

*Primary Examiner* — Vinh P Nguyen
(74) *Attorney, Agent, or Firm* — Arent Fox LLP

(57) ABSTRACT

An inspecting apparatus is for a noncontact power transfer system that transfers electric power from a transmitting unit to a receiving device in a noncontact manner. The inspecting apparatus includes a coupling capacitance varying unit configured to vary at least one of a first coupling capacitance formed between a transmitting-side passive electrode and a receiving-side passive electrode and a second coupling capacitance formed between a transmitting-side active electrode and a receiving-side active electrode when the receiving device is placed on the transmitting unit, and a control unit configured to monitor an alternating-current voltage generated between the receiving-side passive electrode and the receiving-side active electrode of the receiving device or a direct-current voltage obtained through conversion by a rectifying circuit.

10 Claims, 18 Drawing Sheets

(51) Int. Cl.
*G01R 31/00* (2006.01)
*H02J 17/00* (2006.01)
*H02J 7/02* (2016.01)
*G01R 31/04* (2006.01)
*G01R 31/44* (2006.01)

(52) U.S. Cl.
CPC .............. *H02J 7/025* (2013.01); *H02J 17/00* (2013.01); *H02J 50/05* (2016.02)

(58) Field of Classification Search
CPC .... H02J 50/90; H02J 50/10; H02J 3/14; H02J 7/0031; H02J 7/0042; H02J 7/0044; H02J 7/007; H02J 7/0077; H04B 5/0037; H04B 5/0012; H04B 2203/5416; H04B 2203/5454; H04B 2203/547; H04B 3/548; G01R 31/00; G01R 31/04; G01R 31/3627; G01R 31/3648; G01R 31/3686; G01R 31/3689; G01R 31/3696; G01R 31/40

See application file for complete search history.

(56) References Cited

U.S. PATENT DOCUMENTS

| | | | |
|---|---|---|---|
| 2013/0187479 A1* | 7/2013 | Tsuchiya | H02J 7/025 307/109 |
| 2013/0270922 A1* | 10/2013 | Kato | H02J 17/00 307/104 |
| 2014/0232185 A1* | 8/2014 | Sempel | H02J 5/005 307/11 |
| 2014/0253052 A1 | 9/2014 | Goma et al. | |

FOREIGN PATENT DOCUMENTS

| | | |
|---|---|---|
| JP | 2013-102665 A | 5/2013 |
| WO | WO 2011/148803 A1 | 12/2011 |
| WO | WO 2012/070479 A1 | 5/2012 |
| WO | WO 2014/049868 A1 | 4/2014 |
| WO | WO 2013/077086 A1 | 4/2015 |

* cited by examiner

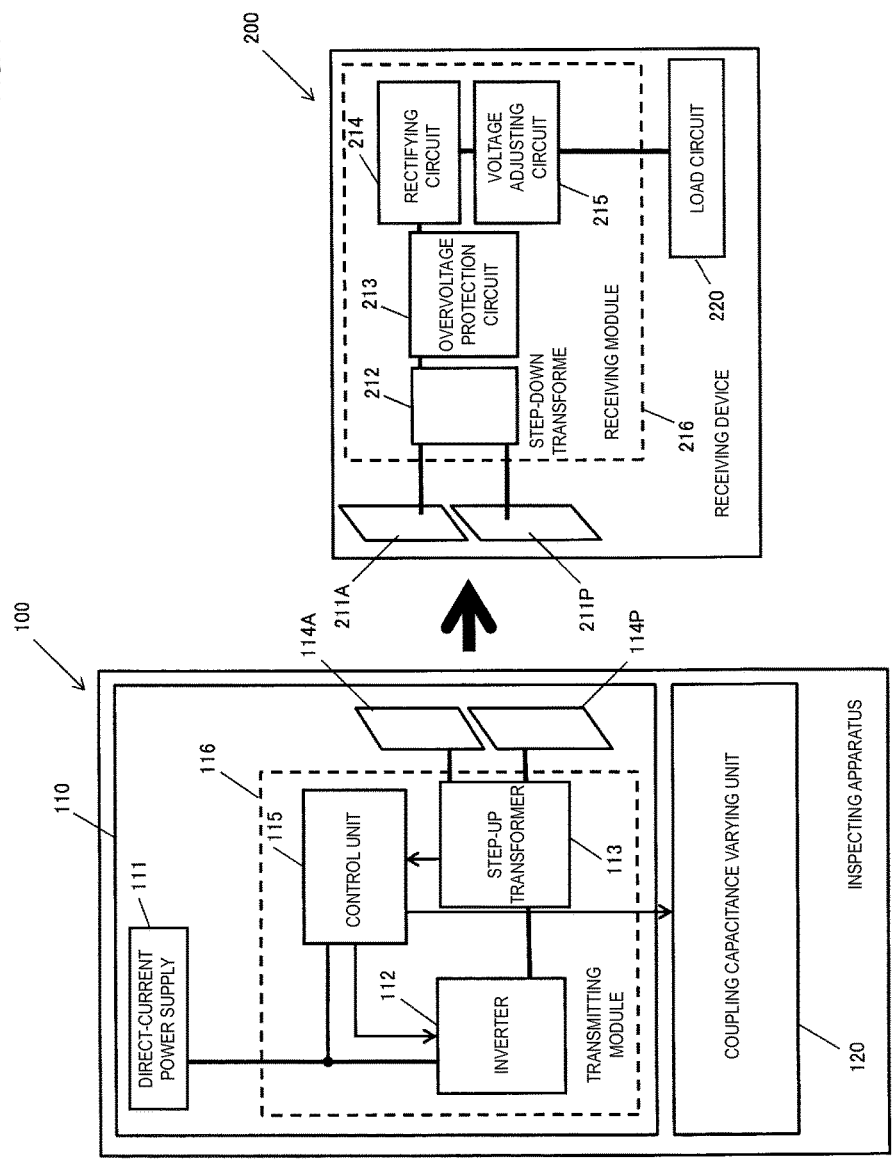

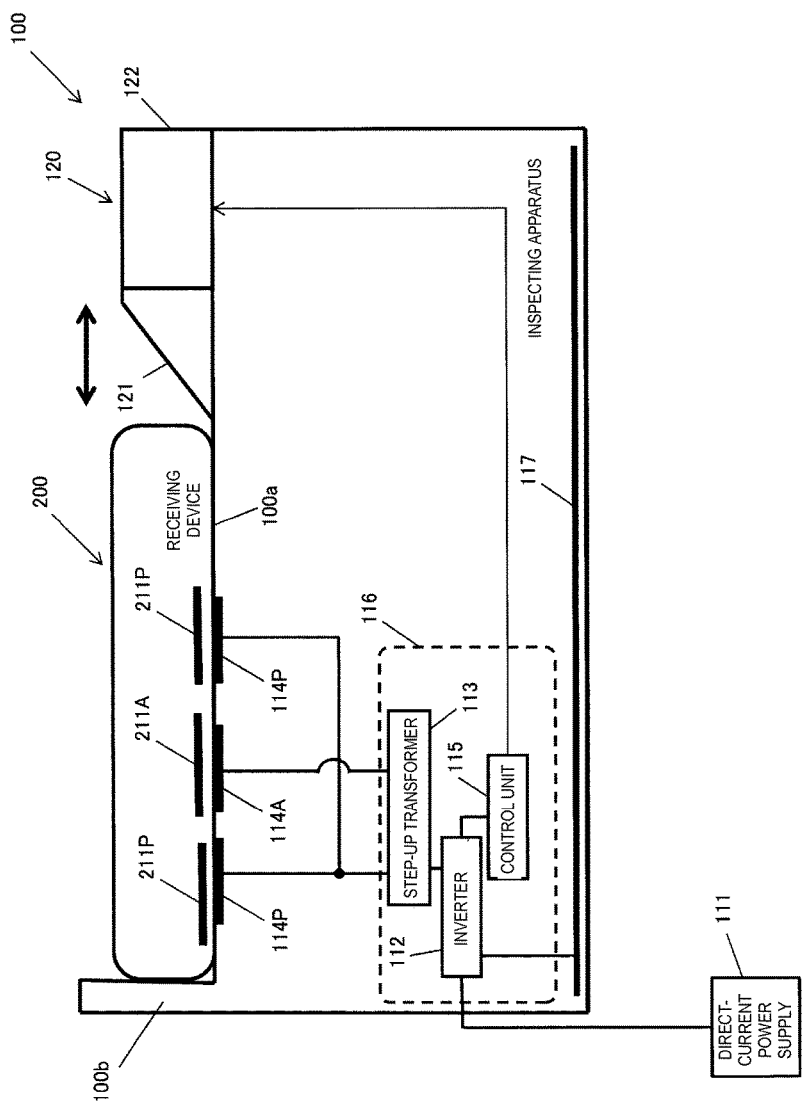

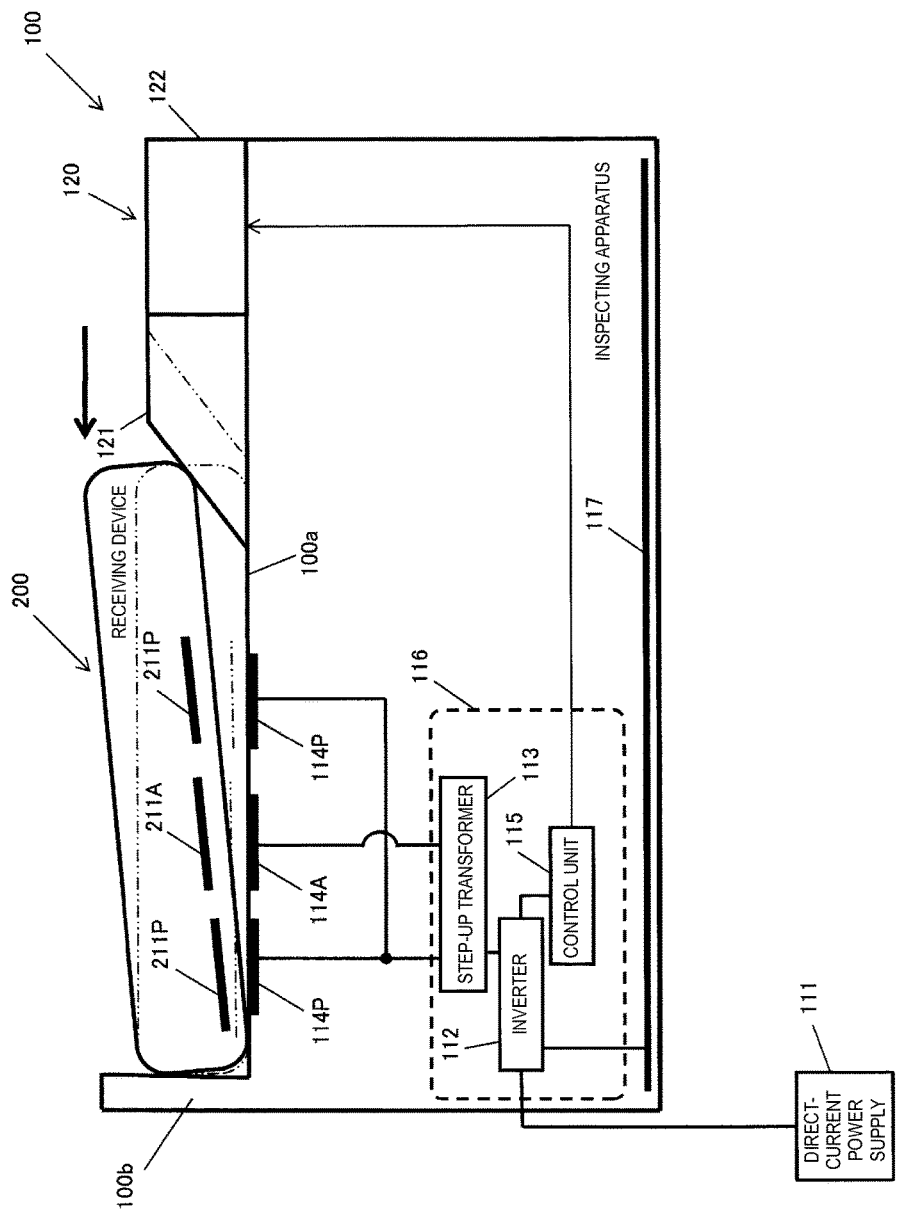

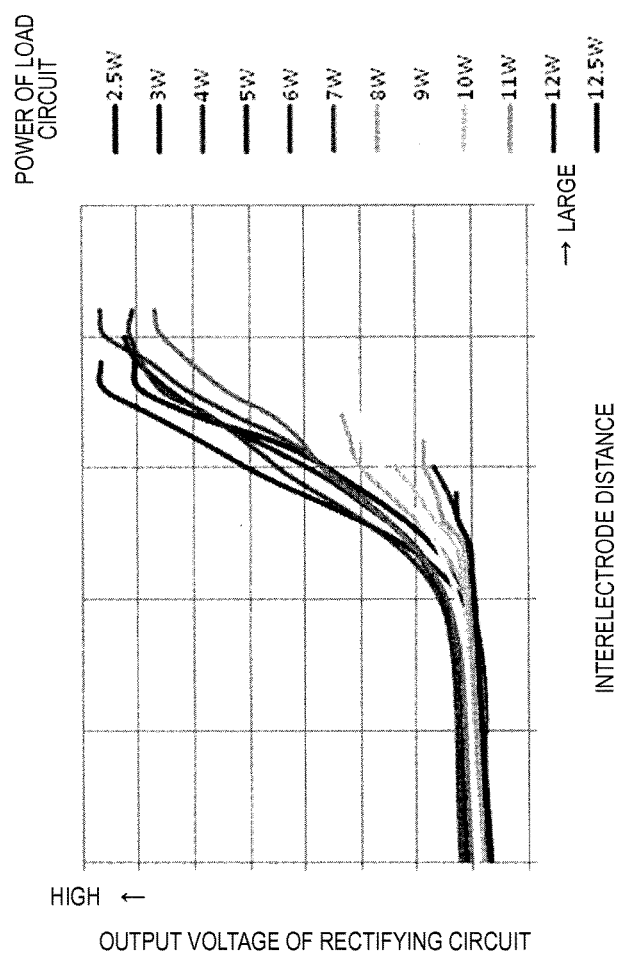

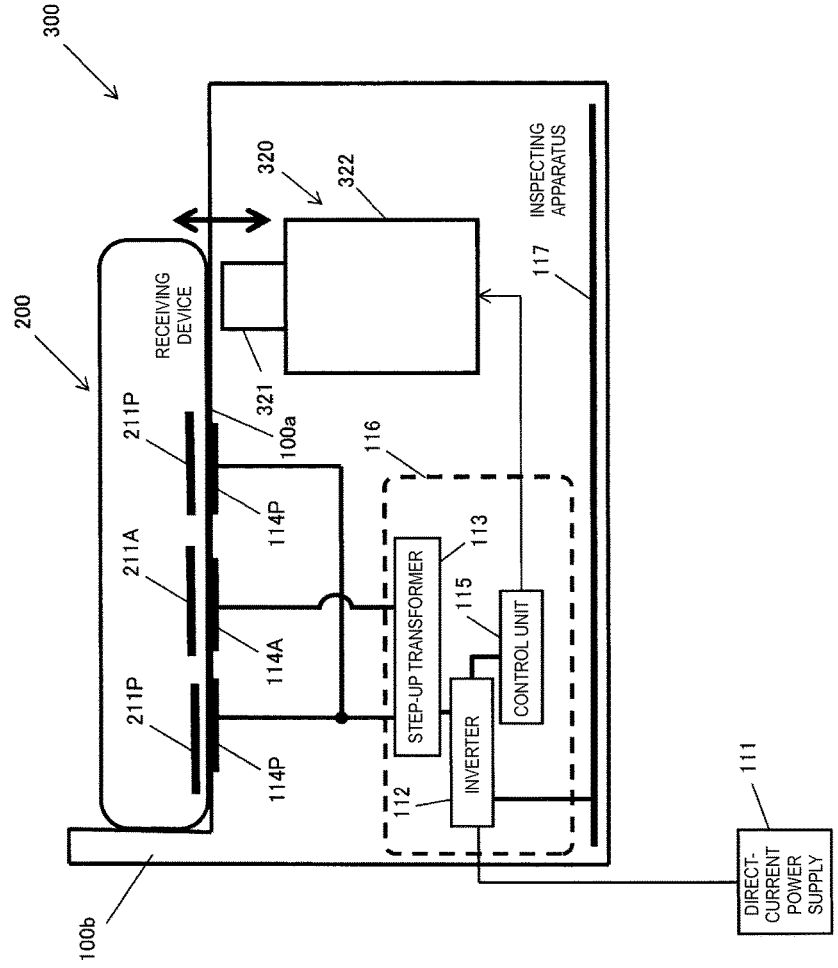

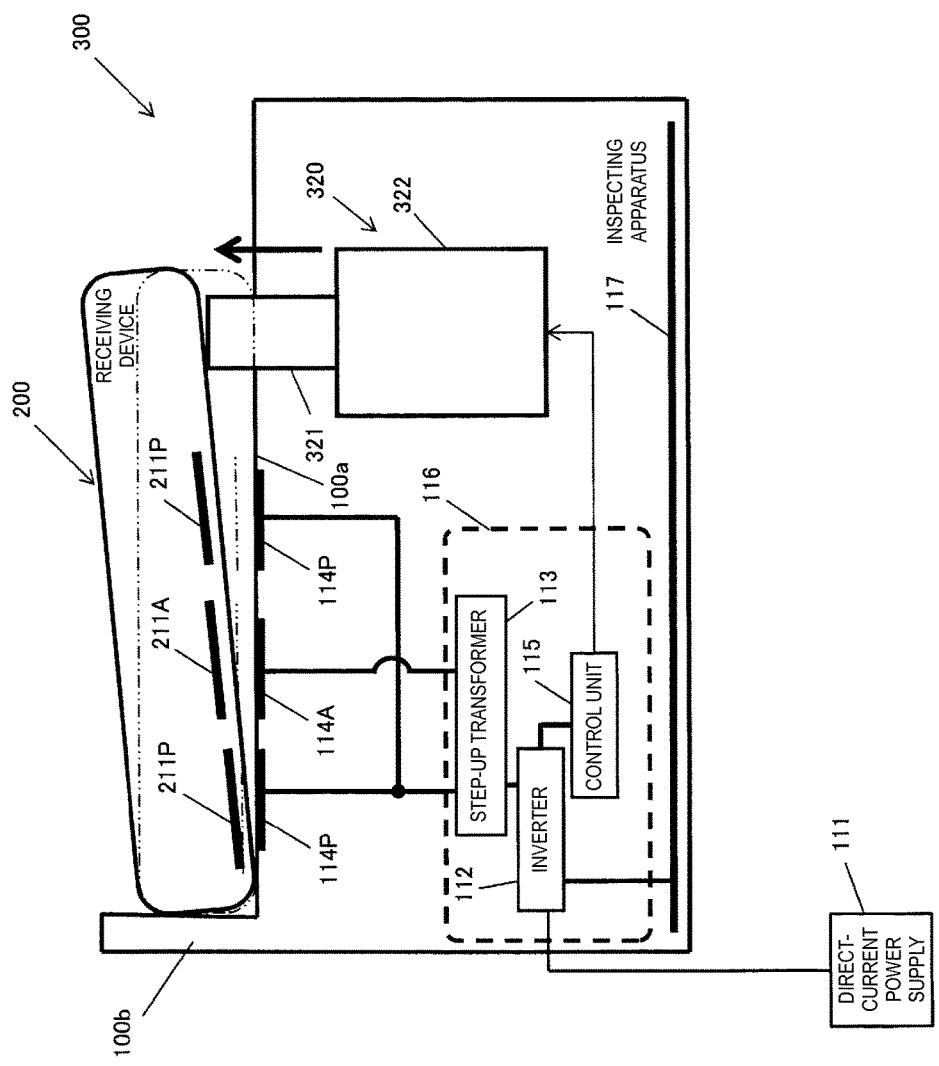

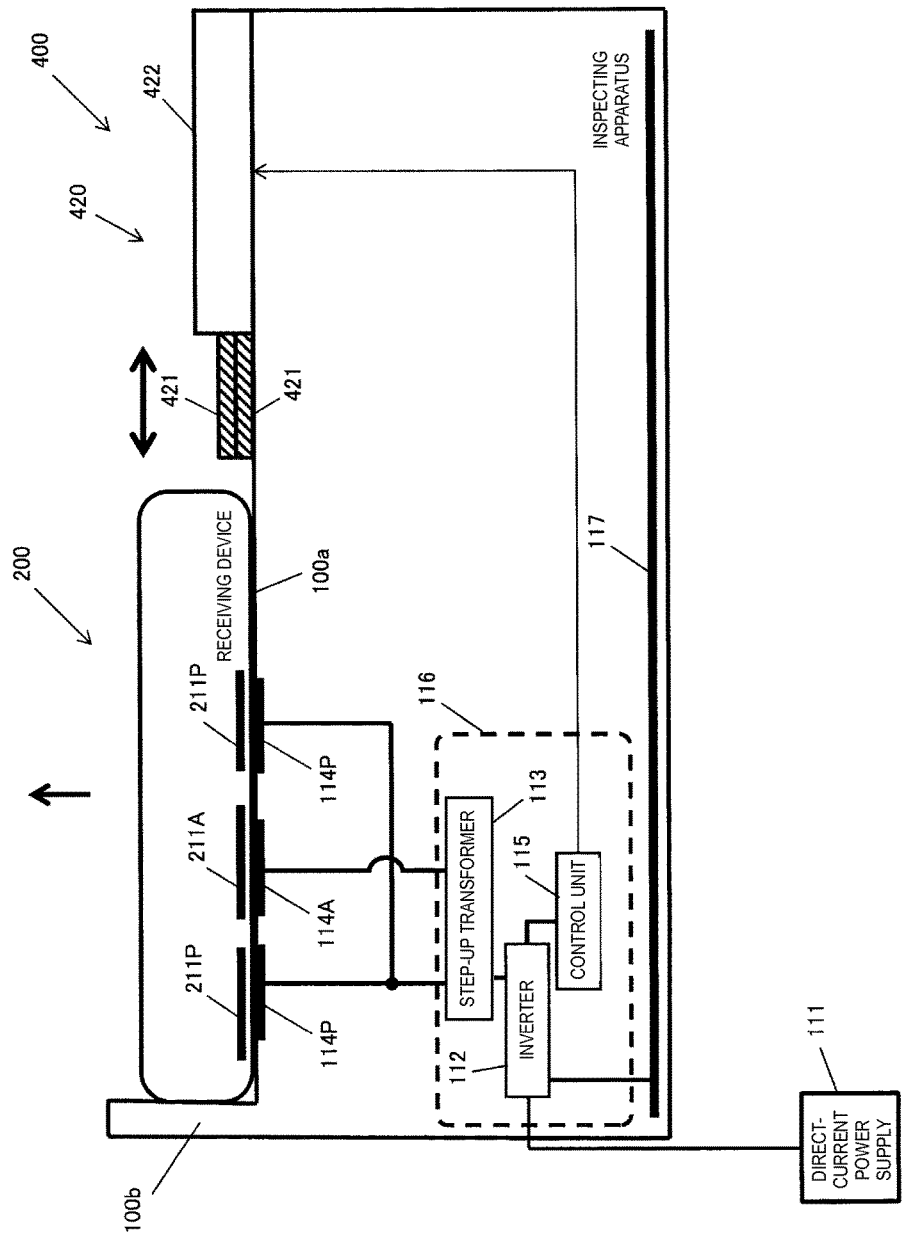

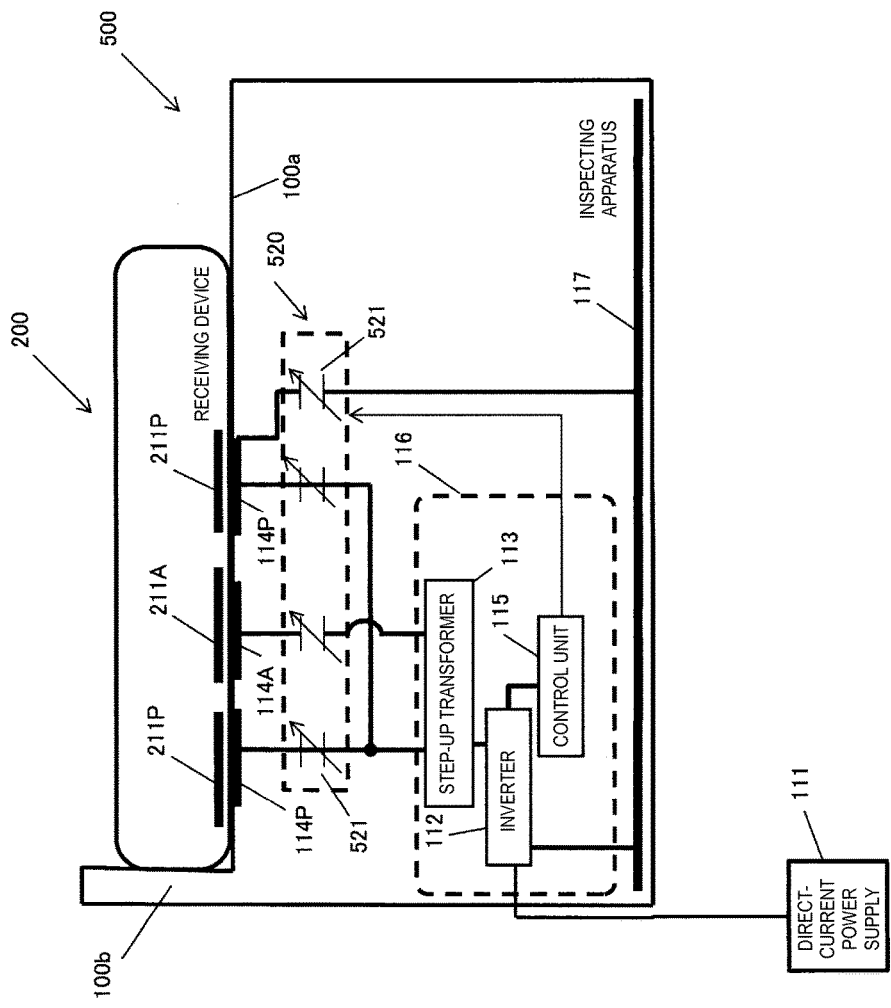

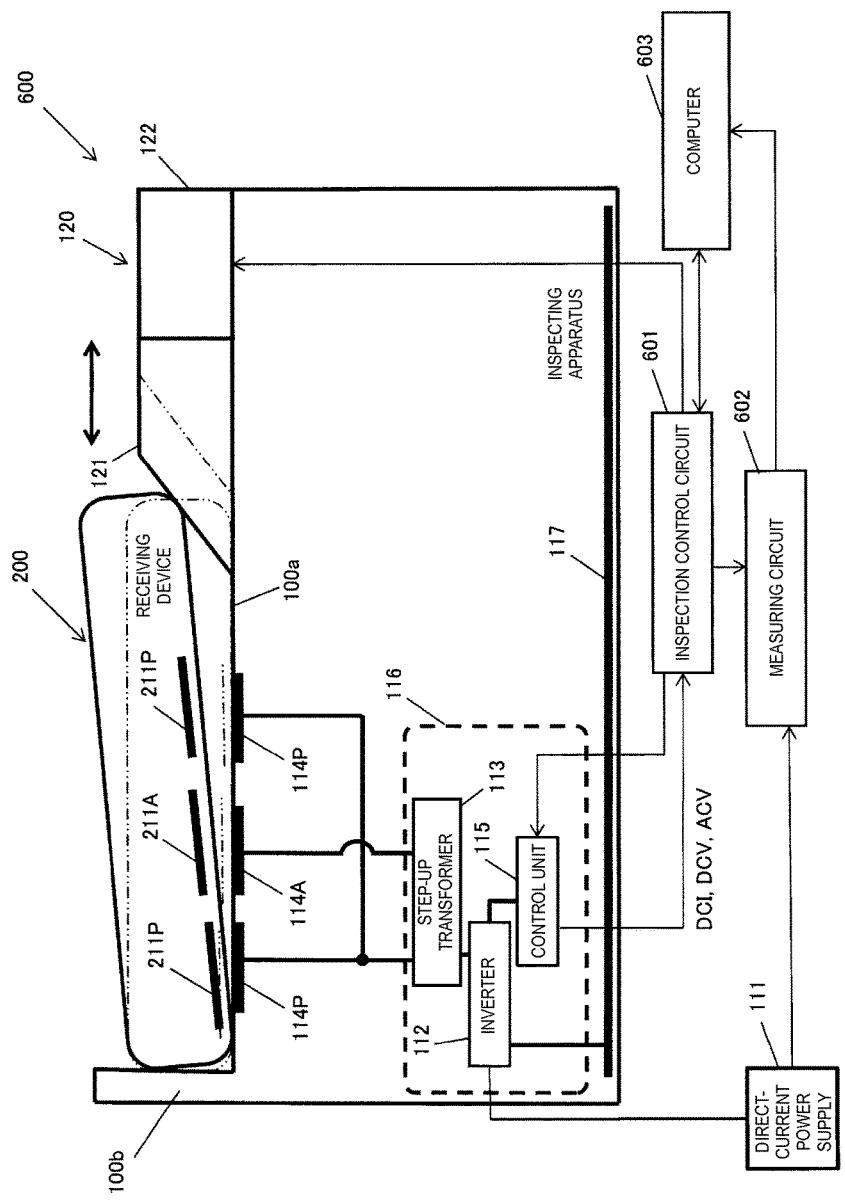

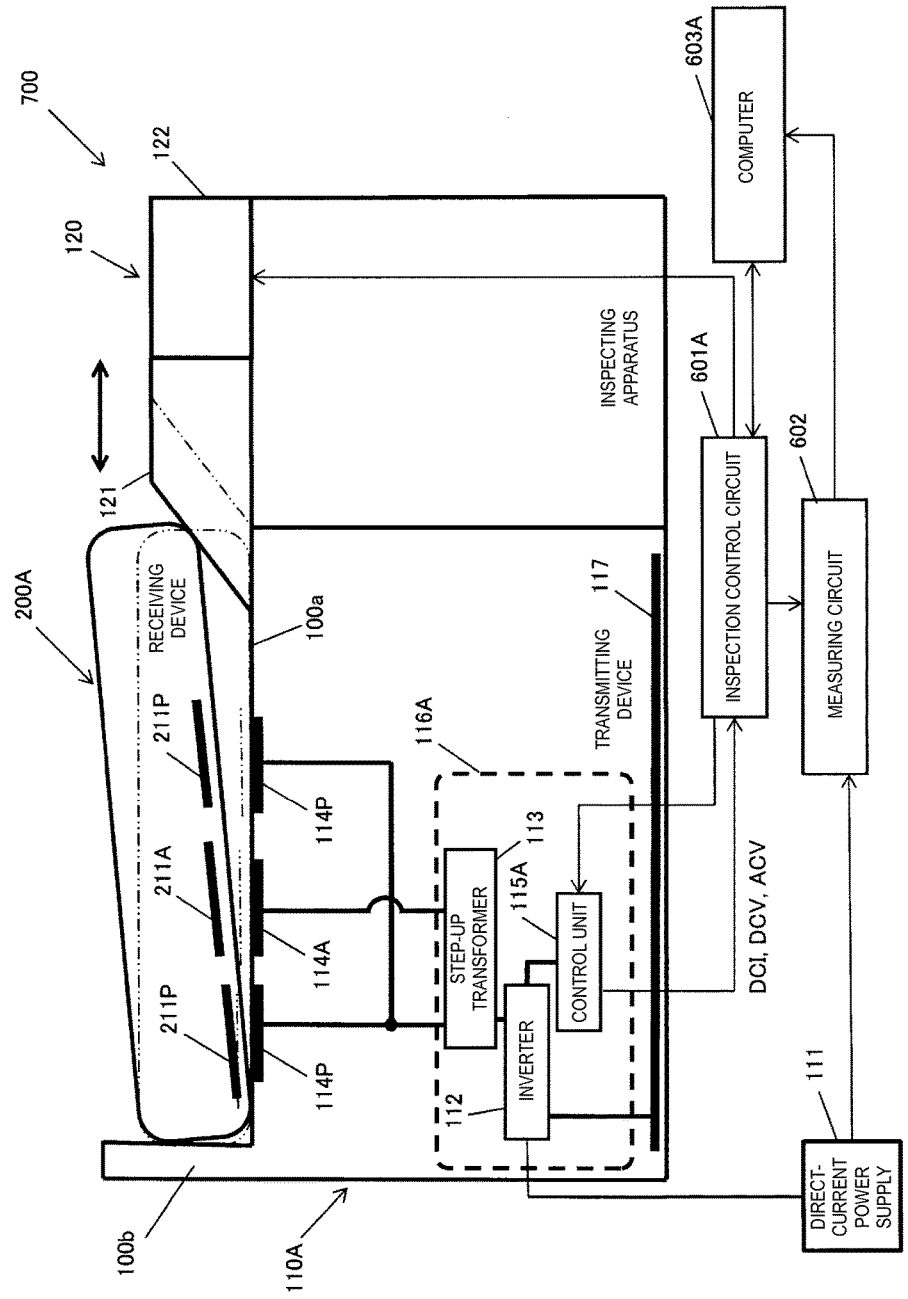

INSPECTING APPARATUS AND INSPECTING METHOD FOR NONCONTACT POWER TRANSFER SYSTEM

CROSS REFERENCE TO RELATED APPLICATIONS

The present application is a continuation of PCT/JP2014/063712 filed May 23, 2014, which claims priority to Japanese Patent Application No. 2013-119817, filed Jun. 6, 2013, and to Japanese Patent Application No. 2013-227227, filed Oct. 31, 2013, the entire contents of each of which are incorporated herein by reference.

FIELD OF THE INVENTION

The present invention relates to an inspecting apparatus and an inspecting method for a noncontact power transfer system that wirelessly transfers electric power.

BACKGROUND OF THE INVENTION

In recent years, noncontact power transfer systems that wirelessly supply electric power to portable devices, such as smartphones and laptop personal computers, have been in practical use. Examples of the noncontact power transfer systems include one described in Patent Document 1.

Patent Document 1 discloses a noncontact power transfer system of an electromagnetic induction type. The noncontact power transfer system of the electromagnetic induction type includes a transmitting device and a receiving device. The transmitting device and the receiving device include a transmitting coil and a receiving coil, respectively, between which electric power is transferred by electromagnetic induction.

Patent Document 2 discloses a noncontact power transfer system of an electric field coupling type. The noncontact power transfer system of the electric field coupling type includes a transmitting device and a receiving device. The transmitting device and the receiving device include a transmitting electrode and a receiving electrode, respectively, between which electric power is transferred by electrostatic induction.

Patent Document 1: Japanese Patent No. 3344593.
Patent Document 2: International Publication No. WO 2011/148803.

In a receiving device of a noncontact power transfer system, an overvoltage may occur between receiving electrodes when the receiving device attached to a transmitting device for power transfer is removed therefrom. The receiving device may include a protection circuit for preventing damage to the receiving device caused by the overvoltage. After the removal of the receiving device, the transmitting device is always required to stop the power transfer.

SUMMARY OF THE INVENTION

An object of the present invention is to provide an inspecting apparatus and an inspecting method that make it possible to easily perform an operation test in a transmitting device or a receiving device included in a noncontact power transfer system.

An inspecting apparatus for a noncontact power transfer system according to a first aspect of the present invention is an apparatus for inspecting a noncontact power transfer system that includes a transmitting device including a first electrode and a second electrode, and an alternating-current voltage generating circuit configured to apply an alternating-current voltage between the first electrode and the second electrode; and a receiving device including a third electrode and a fourth electrode, a receiving circuit configured to convert an alternating-current voltage generated between the third electrode and the fourth electrode to a direct-current voltage, and a load circuit connected to the receiving circuit.

The noncontact power transfer system is configured to transfer electric power from the transmitting device to the receiving device by means of a first coupling capacitance formed between the first electrode and the third electrode and a second coupling capacitance formed between the second electrode and the fourth electrode.

The inspecting apparatus includes a coupling capacitance varying unit configured to vary at least one of the first coupling capacitance and the second coupling capacitance when the receiving device is placed on the transmitting device; and a monitoring unit configured to monitor at least one of the alternating-current voltage generated between the third electrode and the fourth electrode of the receiving device, the direct-current voltage obtained through conversion by the receiving circuit or a load current supplied to the load circuit, the alternating-current voltage generated between the first electrode and the second electrode of the transmitting device, and an input voltage or an input current of the alternating-current voltage generating circuit.

An inspecting method for a noncontact power transfer system according to a second aspect of the present invention is a method for inspecting a noncontact power transfer system that includes a transmitting device including a first electrode and a second electrode, and an alternating-current voltage generating circuit configured to apply an alternating-current voltage between the first electrode and the second electrode; and a receiving device including a third electrode and a fourth electrode, a receiving circuit configured to convert an alternating-current voltage generated between the third electrode and the fourth electrode to a direct-current voltage, and a load circuit connected to the receiving circuit.

The noncontact power transfer system is configured to transfer electric power from the transmitting device to the receiving device by means of a first coupling capacitance formed between the first electrode and the third electrode and a second coupling capacitance formed between the second electrode and the fourth electrode.

The inspecting method includes the steps of varying at least one of the first coupling capacitance and the second coupling capacitance when the receiving device is placed on the transmitting device; and monitoring at least one of the alternating-current voltage generated between the third electrode and the fourth electrode of the receiving device, the direct-current voltage obtained through conversion by the receiving circuit or a load current supplied to the load circuit, the alternating-current voltage generated between the first electrode and the second electrode of the transmitting device, and an input voltage or an input current of the alternating-current voltage generating circuit.

An inspecting apparatus for a transmitting device according to a third aspect of the present invention is an apparatus for inspecting a transmitting device that includes a first electrode and a second electrode, and an alternating-current voltage generating circuit configured to generate an alternating-current voltage by converting a direct current input from a direct-current power supply and apply the generated alternating-current voltage between the first electrode and the second electrode. The transmitting device is configured to transfer electric power from the first electrode and the second electrode to a receiving device in a noncontact manner.

The inspecting apparatus includes a variable load circuit connected to an input of the alternating-current voltage generating circuit and capable of controlling a load impedance, a load impedance control unit configured to vary the load impedance of the variable load circuit, and a monitoring unit configured to monitor the direct current input to the alternating-current voltage generating circuit.

An inspecting method for a transmitting device according to a fourth aspect of the present invention is a method for inspecting a transmitting device that includes a first electrode and a second electrode, and an alternating-current voltage generating circuit configured to generate an alternating-current voltage by converting a direct current input from a direct-current power supply and apply the generated alternating-current voltage between the first electrode and the second electrode.

The transmitting device is configured to transfer electric power from the first electrode and the second electrode to a receiving device in a noncontact manner.

The inspecting method includes the steps of connecting a variable load circuit capable of controlling a load impedance to an output of the transmitting device, and varying the load impedance of the variable load circuit; and monitoring the direct current input to the alternating-current voltage generating circuit.

According to the present invention, it is possible to easily perform an activation test on an overvoltage protection circuit of a receiving device or a transmitting device included in a noncontact power transfer system.

BRIEF DESCRIPTION OF THE DRAWINGS

FIG. 1 is a block diagram illustrating a configuration of a noncontact power transfer system including an inspecting apparatus according to a first embodiment.

FIG. 2A illustrates a general structure of the inspecting apparatus according to the first embodiment.

FIG. 2B illustrates a state of testing performed by the inspecting apparatus according to the first embodiment.

FIG. 5 is a graph showing a characteristic of an output voltage of a rectifying circuit with respect to an interelectrode distance.

FIG. 6A illustrates a general structure of an inspecting apparatus according to a second embodiment.

FIG. 6B illustrates a state of testing performed by the inspecting apparatus according to the second embodiment.

FIG. 7A illustrates a general structure of an inspecting apparatus according to a third embodiment.

FIG. 8 illustrates a general structure of an inspecting apparatus according to a fourth embodiment.

FIG. 9 illustrates a general structure of an inspecting apparatus according to a fifth embodiment.

FIG. 10 illustrates a general structure of an inspecting apparatus according to a sixth embodiment.

DETAILED DESCRIPTION OF THE EXEMPLARY EMBODIMENTS

First Embodiment

Figure 3:
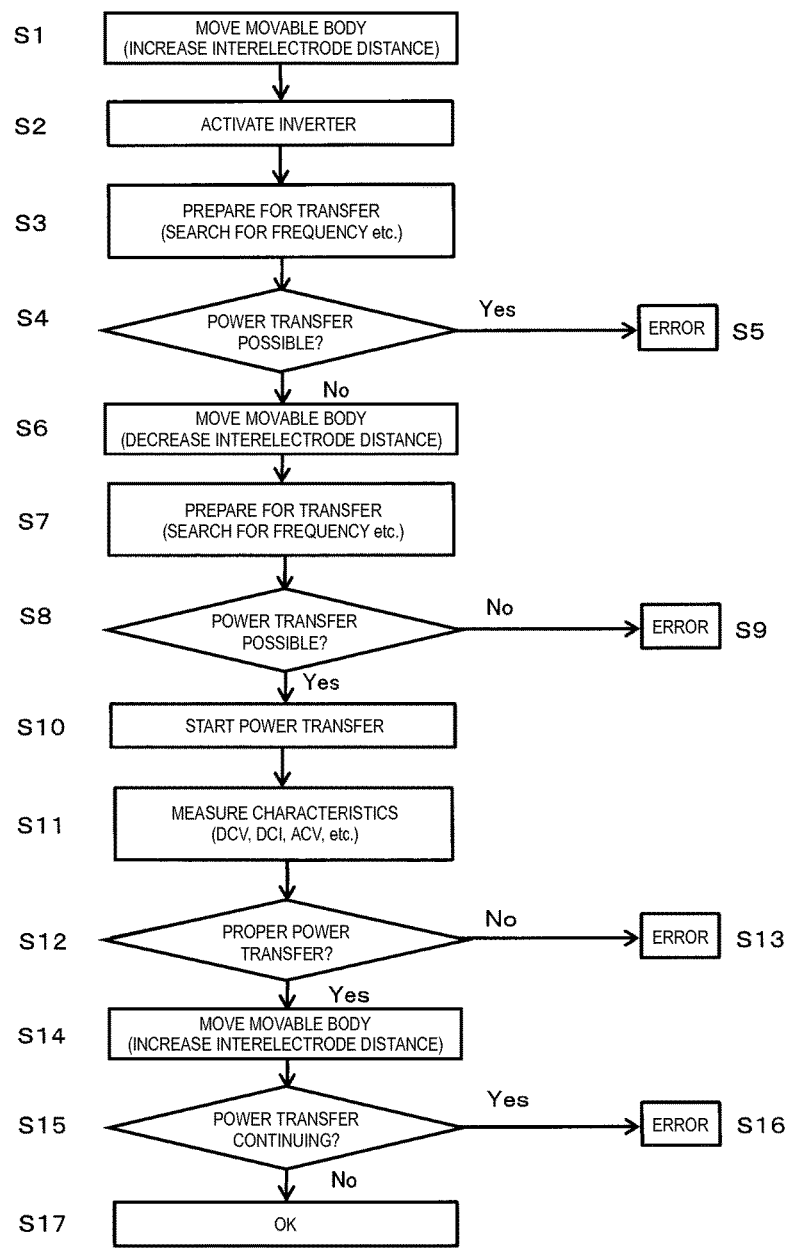
FIG. 3 is a flowchart illustrating an operation of the inspecting apparatus during inspection.

An inspecting apparatus according to a first embodiment of the present invention will be described with reference to FIG. 1. FIG. 1 is a block diagram illustrating a configuration of a noncontact power transfer system including the inspecting apparatus according to the first embodiment.

1. Configuration

The noncontact power transfer system includes an inspecting apparatus 100 including a transmitting unit 110, and a receiving device 200. Configurations of the inspecting apparatus 100 and the receiving device 200 will now be described in detail.

1.1 Inspecting Apparatus

The inspecting apparatus 100 includes the transmitting unit 110 and a coupling capacitance varying unit 120.

The transmitting unit 110 includes a direct-current power supply 111, an inverter 112, a step-up transformer 113, a transmitting-side passive electrode 114P, a transmitting-side active electrode 114A, and a control unit 115. The inverter 112, the step-up transformer 113, and the control unit 115 form a transmitting module 116.

The direct-current power supply 111 generates a predetermined direct-current voltage. The direct-current power supply 111 is, for example, an AC adapter configured to convert an alternating-current voltage of 100 V to a predetermined direct-current voltage.

The inverter 112 converts a direct-current voltage output from the direct-current power supply 111 to an alternating-current voltage of, for example, 100 kHz to several tens of MHz by switching on the basis of a drive signal from the control unit 115, and outputs the alternating-current voltage.

The step-up transformer 113 increases the alternating-current voltage output from the inverter 112 and applies the resulting voltage between the transmitting-side passive electrode 114P and the transmitting-side active electrode 114A. For example, the alternating-current voltage is increased by the step-up transformer 113 to the range of 100 V to 10 kV. By applying this voltage between the transmitting-side passive electrode 114P and the transmitting-side active electrode 114A, an electric field is produced in the surrounding medium.

The control unit 115 controls the operation of the inspecting apparatus 100. The control unit 115 detects a voltage value DCV and a current value DCI of direct-current power supplied from the direct-current power supply 111 to the inverter 112. The control unit 115 detects an alternating-current voltage value ACV on the secondary side of the step-up transformer 113, that is, a voltage between the transmitting-side active electrode 114A and the transmitting-side passive electrode 114P. The alternating-current voltage value ACV is substantially proportional to an alternating-current voltage generated between a receiving-side passive electrode 211P and a receiving-side active electrode 211A of the receiving device 200 (described below), or to a direct-current voltage obtained through conversion by a rectifying circuit 214. This means that the control unit 115 monitors the alternating-current voltage generated between the receiving-side passive electrode 211P and the receiving-side active electrode 211A of the receiving device 200, or the direct-current voltage obtained through conversion by the rectifying circuit 214.

By detecting a voltage between the transmitting-side active electrode 114A and a reference potential of the inspecting apparatus 100, the control unit 115 can indirectly monitor the alternating-current voltage generated between the receiving-side passive electrode 211P and the receiving-side active electrode 211A of the receiving device, or the direct-current voltage obtained through conversion by the rectifying circuit 214. Alternatively, the control unit 115 may detect a voltage between the transmitting-side passive electrode 114P and the reference potential of the inspecting apparatus 100, instead of the voltage between the transmitting-side active electrode 114A and the reference potential of the inspecting apparatus 100.

Thus, by detecting a voltage of a transmitting electrode part of the transmitting module 116, such as the voltage between the transmitting-side active electrode 114A and the transmitting-side passive electrode 114P, the voltage between the transmitting-side active electrode 114A and the reference potential of the inspecting apparatus 100, or the voltage between the transmitting-side passive electrode 114P and the reference potential of the inspecting apparatus 100, the control unit 115 can monitor the voltage of a receiving module 216, such as the alternating-current voltage generated between the receiving-side passive electrode 211P and the receiving-side active electrode 211A or the direct-current voltage obtained through conversion by the rectifying circuit 214.

Although the control unit 115 monitors the voltage obtained after being increased by the step-up transformer 113 in the example described above, the control unit 115 may monitor an input current from the direct-current power supply 111.

An inductance of the step-up transformer 113 and a capacitance between the transmitting-side passive electrode 114P and the transmitting-side active electrode 114A form a resonant circuit on the transmitting side.

The configuration of the coupling capacitance varying unit 120 will be described later on.

1.2 Receiving Device

The receiving device 200 includes the receiving-side passive electrode 211P, the receiving-side active electrode 211A, a step-down transformer 212, an overvoltage protection circuit 213, the rectifying circuit 214, a voltage adjusting circuit 215, and a load circuit 220. The step-down transformer 212, the overvoltage protection circuit 213, the rectifying circuit 214, and the voltage adjusting circuit 215 form the receiving module 216.

With the receiving device 200 placed at a predetermined location on a loading surface 100a of the inspecting apparatus 100 on which the receiving device 200 can be placed, a first coupling capacitance is formed between the transmitting-side active electrode 114A and the receiving-side active electrode 211A and a second coupling capacitance is formed between the transmitting-side passive electrode 114P and the receiving-side passive electrode 211P. A combined capacitance of the first coupling capacitance and the second coupling capacitance is referred to as a "transmission/reception coupling capacitance". By means of the transmission/reception coupling capacitance, electric power is transferred from the transmitting unit 110 of the inspecting apparatus 100 to the receiving device 200.

The step-down transformer 212 decreases the voltage between the receiving-side passive electrode 211P and the receiving-side active electrode 211A, and outputs the resulting voltage through the overvoltage protection circuit 213 to the rectifying circuit 214.

The overvoltage protection circuit 213 limits the supply of electric power to the rectifying circuit 214 when the output voltage of the step-down transformer 212 becomes greater than or equal to a predetermined voltage.

The rectifying circuit 214 rectifies an input alternating-current voltage to generate a direct-current voltage, and outputs the generated direct-current voltage to the voltage adjusting circuit 215.

The voltage adjusting circuit 215 adjusts the direct-current voltage output from the rectifying circuit 214 to a direct-current voltage suitable for the load circuit 220, and outputs the resulting direct-current voltage to the load circuit 220.

The load circuit 220 includes, for example, a touch panel and executes a predetermined function designated by touching the touch panel.

An inductance of the step-down transformer 212 and a capacitance between the receiving-side passive electrode 211P and the receiving-side active electrode 211A form a resonant circuit on the receiving side.

The frequency of transfer of electric power from the transmitting unit 110 of the inspecting apparatus 100 to the receiving device 200 is set on the basis of a resonant frequency of a combined resonant circuit formed by the resonant circuit on the transmitting side and the resonant circuit on the receiving side, with the transmission/reception coupling capacitance therebetween.

1.3 Coupling Capacitance Varying Unit

The inspecting apparatus 100 of the present embodiment has the function of performing an activation test on the overvoltage protection circuit 213 of the receiving device 200. In the present embodiment, the inspecting apparatus 100 includes the coupling capacitance varying unit 120 that varies the transmission/reception coupling capacitance, with the receiving device 200 placed on the loading surface 100a of the inspecting apparatus 100.

FIG. 2A illustrates a general structure of the inspecting apparatus according to the first embodiment. FIG. 2B illustrates a state of testing performed by the inspecting apparatus according to the first embodiment.

The inspecting apparatus 100 has the loading surface 100a on which the receiving device 200 can be placed. A wall portion 100b protruding upward from the loading surface 100a is provided at one end of the loading surface 100a. When the receiving device 200 is placed on the loading surface 100a of the inspecting apparatus 100, an end portion of the receiving device 200 comes into contact with the wall portion 100b, so that the loading position of the receiving device 200 on the loading surface 100a is defined (i.e., the receiving device 200 is positioned at a predetermined location on the loading surface 100a). The transmitting-side passive electrode 114P and the transmitting-side active electrode 114A are arranged on the loading surface 100a. The transmitting-side passive electrode 114P and the transmitting-side active electrode 114A are arranged to face the receiving-side passive electrode 211P and the receiving-side active electrode 211A, respectively, of the receiving device 200 in a predetermined facing state when the receiving device 200 is placed at the predetermined location on the loading surface 100a. The predetermined facing state is a state which allows a predetermined power transfer state to be achieved. For example, the predetermined power transfer state is a state in which a predetermined amount of electric power can be transferred.

The coupling capacitance varying unit 120 is disposed on the loading surface 100a of the inspecting apparatus 100. The coupling capacitance varying unit 120 includes a movable body 121 and a driving part 122.

The movable body 121 is movably disposed on the loading surface 100a. The movable body 121 has a wedge shape.

The driving part 122 is capable of moving the movable body 121 toward the receiving device 200 in a direction parallel to the loading surface 100a. The driving part 122 includes, for example, a motor and a connection for transmitting the power of the motor to the movable body 121. The drive of the motor of the driving part 122 is controlled on the basis of a drive signal from the control unit 115.

The driving part 122 moves the movable body 121 in a horizontal direction between a reference position shown in FIG. 2A and an inspection position shown in FIG. 2B. At the inspection position, as illustrated in FIG. 2B, a leading end of the movable body 121 enters the space between the receiving device 200 and the loading surface 100a of the inspecting apparatus 100. This causes the receiving device 200 to be raised at one end thereof, and widens the distance from the transmitting-side passive electrode 114P and the transmitting-side active electrode 114A of the inspecting apparatus 100 to the receiving-side passive electrode 211P and the receiving-side active electrode 211A of the receiving device 200. Thus, the transmission/reception coupling capacitance decreases, and the output impedance of the inspecting apparatus 100 increases. Since the load circuit 220 of the receiving device 200 requires constant power, the inspecting apparatus 100 increases the alternating-current voltage value ACV. This increases the voltage between the receiving-side passive electrode 211P and the receiving-side active electrode 211A of the receiving device 200.

A reference electrode 117 is disposed over a bottom surface of a housing of the inspecting apparatus 100. The reference electrode 117 serves as a shielding member to improve inspection accuracy.

2. Inspecting Operation

FIG. 3 is a flowchart illustrating an inspecting operation of the inspecting apparatus 100.

The control unit 115 outputs a drive signal to the driving part 122 to move the movable body 121 toward the receiving device 200 by a predetermined distance. The predetermined distance is a distance which allows, as illustrated in FIG. 2B, the movable body 121 to enter the space between the receiving device 200 and the loading surface 100a of the inspecting apparatus 100, so that the receiving device 200 is raised by a predetermined height at one end thereof (S1). The predetermined height is a height which does not allow proper power transfer from the inspecting apparatus 100 to the receiving device 200. Specifically, the predetermined height is a height which makes the transmission/reception coupling capacitance smaller by a given amount than a coupling capacitance (hereinafter appropriately referred to as "predetermined coupling capacitance") which allows proper power transfer from the inspecting apparatus 100 to the receiving device 200.

The control unit 115 activates the inverter 112 (S2). This causes a predetermined alternating-current voltage to be output from the inverter 112.

The control unit 115 performs a preparation operation for power transfer (S3). For example, as a preparation operation for power transfer, the control unit 115 measures, while varying the transmission frequency, the output impedance of the inspecting apparatus 100 in a state where power smaller than that during normal power transfer is being output, and determines a transmission frequency which allows most efficient power transfer on the basis of the measured output impedance.

The control unit 115 determines whether power transfer is possible (S4). When nothing is wrong with the receiving device 200, the transmission/reception coupling capacitance is smaller than the predetermined coupling capacitance, as described above, in a state where the receiving device 200 is raised by the predetermined height at one end thereof. In the present embodiment, a determination of whether the transmission/reception coupling capacitance is smaller than the predetermined coupling capacitance is made on the basis of a change in the output impedance of the inspecting apparatus 100. When the transmission/reception coupling capacitance is smaller than the predetermined coupling capacitance, the output impedance at the transmission frequency determined as described above is greater than the output impedance suitable for power transfer (hereinafter referred to as "predetermined impedance"). In this case, power transfer cannot be properly performed. However, if something is wrong with the receiving device 200, that is, for example, if something is wrong with the receiving-side passive electrode 211P and the receiving-side active electrode 211A or the internal circuit of the receiving device 200, the output impedance at the determined transmission frequency may be less than or equal to the predetermined impedance. Therefore, in the present embodiment, the determination of whether power transfer is possible is made on the basis of whether the output impedance at the determined transmission frequency is greater than the predetermined impedance. Note that the determination of whether power transfer is possible means, as described above, to determine whether something is wrong with the receiving device 200.

If the output impedance at the determined transmission frequency is less than or equal to the predetermined impedance, the control unit 115 determines that power transfer is possible, that is, something is wrong with the receiving device 200 (S5).

On the other hand, if the output impedance at the determined transmission frequency is greater than the predetermined impedance, the control unit 115 determines that the condition is not suitable for power transfer, that is, nothing is wrong with the receiving device 200. Then, the control unit 115 outputs a drive signal to the driving part 122 to move the movable body 121 back to the reference position shown in FIG. 2A (S6).

The control unit 115 performs a preparation operation for power transfer in the same manner as in step S3 (S7).

On the basis of the value of the output impedance, the control unit 115 determines whether power transfer is possible (S8). Since the receiving device 200 is placed on the loading surface 100a of the inspecting apparatus 100, the control unit 115 will normally determine in step S8 that power transfer is possible. However, the operation in step S8 is intended to determine an abnormal state where transfer is not possible. On the other hand, in step S4, where the receiving device 200 is spaced from the loading surface 100a of the inspecting apparatus 100, the control unit 115 will normally not determine that power transfer is possible. However, the operation in step S4 is intended to determine an abnormal state where power transfer is possible. Since the receiving device 200 is placed on the loading surface 100a of the inspecting apparatus 100 during the execution of step S8, the output impedance at the determined transmission frequency should be less than the predetermined impedance. Therefore, in the present embodiment, the determination of whether power transfer is possible is made on the basis of whether the output impedance at the determined transmission frequency is less than the predetermined impedance.

Then, if the output impedance at the determined transmission frequency is greater than or equal to the predetermined impedance, the control unit 115 determines that power transfer is not possible, that is, something is wrong with the receiving device 200 (S9).

On the other hand, if the output impedance at the determined transmission frequency is less than the predetermined impedance, the control unit 115 determines that power transfer is possible, that is, nothing is wrong with the receiving device 200. The control unit 115 starts the operation of power transfer to the receiving device 200 (S10).

The control unit 115 starts to measure the direct current value DCI and the direct-current voltage value DCV of direct-current power output from the direct-current power supply 111 and the voltage value ACV of the alternating-current voltage applied to the transmitting-side active electrode 114A (S11). This measurement is executed at predetermined time intervals until the end of the present flowchart.

On the basis of the result of the measurement in step S11, the control unit 115 determines whether the power transfer is being performed properly (S12).

If determining that the power transfer is not being performed properly, the control unit 115 determines that something is wrong with the receiving device 200 (S13).

On the other hand, if determining that the power transfer is being performed properly, the control unit 115 outputs a drive signal to the driving part 122, during the power transfer, to move the movable body 121 to the inspection position shown in FIG. 2B so that the receiving device 200 is raised by the predetermined height at one end thereof (S14).

In this state, the control unit 115 determines whether the power transfer is continuing (S15). Specifically, the control unit 115 determines a threshold voltage on the basis of the direct current value DCI measured after the execution of step S14 and the characteristic shown in FIG. 4. The control unit 115 determines whether the alternating-current voltage value ACV measured after the execution of step S14 is greater than or equal to the determined threshold voltage. If the measured alternating-current voltage value ACV is greater than or equal to the threshold voltage, the control unit 115 determines that the power transfer is continuing, that is, the overvoltage protection circuit 213 of the receiving device 200 is not working (S16). In other words, the control unit 115 determines that something is wrong with the overvoltage protection circuit 213 of the receiving device 200.

On the other hand, if the measured alternating-current voltage value ACV is less than the threshold voltage, the control unit 115 determines that the power transfer has stopped, that is, the overvoltage protection circuit 213 of the receiving device 200 has been activated. In other words, the control unit 115 determines that the overvoltage protection circuit 213 of the receiving device 200 is working properly (S17).

Figure 4:
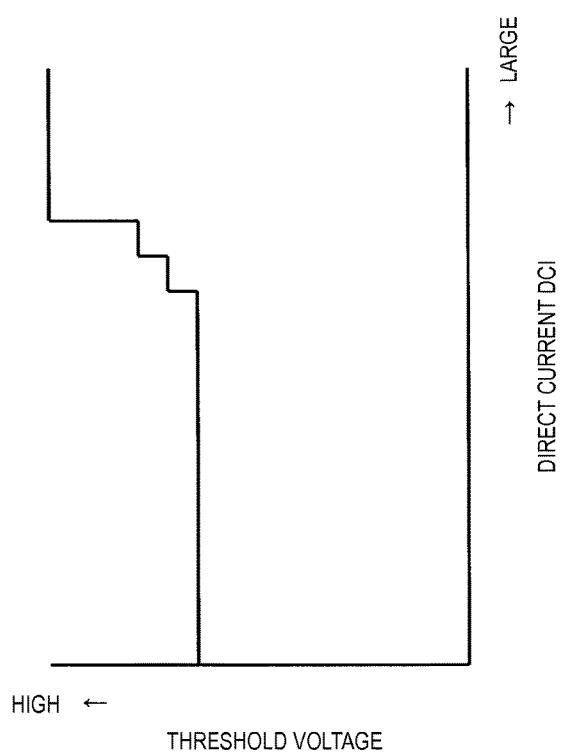
FIG. 4 is a graph showing a characteristic of a threshold voltage with respect to a measured direct current.

FIG. 4 is a graph showing a characteristic of the threshold voltage with respect to the measured direct current value DCI. The threshold voltage is set on the basis of the measured direct current value DCI. The greater the measured direct current value DCI, the greater the set threshold voltage. There is a tendency in which the greater the direct current value DCI or direct-current power, the greater the alternating-current voltage value ACV during normal power transfer. FIG. 5 is a graph for explaining this tendency. Specifically, FIG. 5 is a graph showing a characteristic of the output voltage of the rectifying circuit 214 of the receiving device 200 with respect to the distance from the receiving-side passive electrode 211P and the receiving-side active electrode 211A of the receiving device to the transmitting-side active electrode 114A and the transmitting-side passive electrode 114P of the inspecting apparatus 100. As shown in FIG. 5, the greater the power consumption of the load circuit 220, the higher the output voltage of the rectifying circuit 214 of the receiving device 200. The output voltage of the rectifying circuit 214 of the receiving device 200 is substantially proportional to the alternating-current voltage value ACV. That is, there is a tendency in which the greater the direct current value DCI or direct-current power, the greater the alternating-current voltage value ACV. Therefore, by taking this tendency into account and referring to the characteristic shown in FIG. 4, the threshold voltage is set on the basis of the direct current value DCI.

3. Summary

The inspecting apparatus 100 of the present embodiment is an apparatus for inspecting a noncontact power transfer system.

The noncontact power transfer system includes the transmitting unit 110 (transmitting device) including the transmitting-side active electrode 114A and the transmitting-side passive electrode 114P (a first electrode and a second electrode), and the inverter 112 and the step-up transformer 113 (alternating-current voltage generating circuit) configured to apply an alternating-current voltage between the transmitting-side active electrode 114A and the transmitting-side passive electrode 114P; and the receiving device 200 including the receiving-side active electrode 211A and the receiving-side passive electrode 211P (a third electrode and a fourth electrode), the step-down transformer 212 and the rectifying circuit 214 (receiving circuit) configured to convert an alternating-current voltage generated between the receiving-side active electrode 211A and the receiving-side passive electrode 211P to a direct-current voltage, and the load circuit 220 connected to the rectifying circuit 214.

The noncontact power transfer system is configured to transfer electric power from the transmitting unit 110 to the load circuit 220 by means of a first coupling capacitance formed between the transmitting-side passive electrode 114P and the receiving-side passive electrode 211P and a second coupling capacitance formed between the transmitting-side active electrode 114A and the receiving-side active electrode 211A.

The inspecting apparatus 100 includes the coupling capacitance varying unit 120 configured to vary at least one of the first coupling capacitance and the second coupling capacitance when the receiving device 200 is placed on the transmitting unit 110;

and the control unit 115 (monitoring unit) configured to monitor either the alternating-current voltage generated between the receiving-side passive electrode 211P and the receiving-side active electrode 211A of the receiving device 200 or the direct-current voltage obtained through conversion by the rectifying circuit 214.

With this configuration, an activation test on the overvoltage protection circuit 213 can be easily performed in the receiving device 200 of the noncontact power transfer system.

In the inspecting apparatus 100 of the present embodiment, the coupling capacitance varying unit 120 and the control unit 115 are integral with the transmitting unit 110.

With this configuration, there is no need to connect the coupling capacitance varying unit 120 and the control unit 115 to the transmitting unit 110 for inspection. This makes inspection easier.

In the inspecting apparatus 100 of the present embodiment, the coupling capacitance varying unit 120 includes the movable body 121 and the driving part 122 (mechanism) that physically widen the distance (gap) between surfaces of the transmitting unit 110 and the receiving device 200 that are in contact with each other.

With this configuration, it is possible to reproduce conditions similar to those under which the user removes the receiving device 200 from the transmitting device (charging cradle etc.). Therefore, an activation test on the overvoltage protection circuit 213 of the receiving device 200 can be properly performed under conditions similar to actual use conditions.

In particular, in the present embodiment, the inspecting apparatus 100 raises one end of the receiving device 200. Thus, the receiving device 200 is raised in an inclined position relative to the horizontal. When the user removes the receiving device 200 from the transmitting device, the receiving device 200 is often in such an inclined position. Therefore, an activation test can be performed under conditions close to actual use conditions.

In the present embodiment, an activation test on the overvoltage protection circuit 213 is performed by moving the receiving device 200 upward to vary the transmission/reception coupling capacitance. The transmission/reception coupling capacitance can also be varied by moving the receiving device 200 in the horizontal direction. This means that the activation test on the overvoltage protection circuit 213 may be performed by moving the receiving device 200 in the horizontal direction. Changes in transmission/reception coupling capacitance become more pronounced by moving the receiving device 200 upward than by moving it in the horizontal direction. Therefore, the activation test on the overvoltage protection circuit 213 can be performed more easily by moving the receiving device 200 upward.

Second Embodiment

An inspecting apparatus according to a second embodiment will be described with reference to FIGS. 6A and 6B. FIG. 6A illustrates a general structure of the inspecting apparatus according to the second embodiment. FIG. 6B illustrates a state of testing performed by the inspecting apparatus according to the second embodiment. The inspecting apparatus of the present embodiment differs from that of the first embodiment in the structure of the coupling capacitance varying unit.

A coupling capacitance varying unit 320 of an inspecting apparatus 300 according to the present embodiment includes a movable body 321 and a driving part 322.

The movable body 321 is movably disposed below the loading surface 100a. For example, the movable body 321 has a rectangular prismatic shape.

The driving part 322 is disposed below the loading surface 100a. The driving part 322 is capable of moving the movable body 321 in the up-and-down direction. The driving part 322 includes, for example, a motor and a connection for transmitting the power of the motor to the movable body 321. The drive of the motor of the driving part 322 is controlled on the basis of a drive signal from the control unit 115.

The driving part 322 moves the movable body 321 in the up-and-down direction between a reference position shown in FIG. 6A and an inspection position shown in FIG. 6B. At the inspection position, as illustrated in FIG. 6B, the movable body 321 is raised to a position higher than the loading surface 100a. This causes the receiving device 200 to be raised at one end thereof, and widens the distance from the transmitting-side passive electrode 114P and the transmitting-side active electrode 114A of the inspecting apparatus 300 to the receiving-side passive electrode 211P and the receiving-side active electrode 211A of the receiving device 200. Thus, the transmission/reception coupling capacitance decreases, and the inspecting apparatus 300 increases the alternating-current voltage value ACV. This makes it possible to perform an activation test on the overvoltage protection circuit 213.

Thus, as in the first embodiment, an activation test on the overvoltage protection circuit 213 can be easily performed in the receiving device 200 of the noncontact power transfer system.

Third Embodiment

Figure 7B:
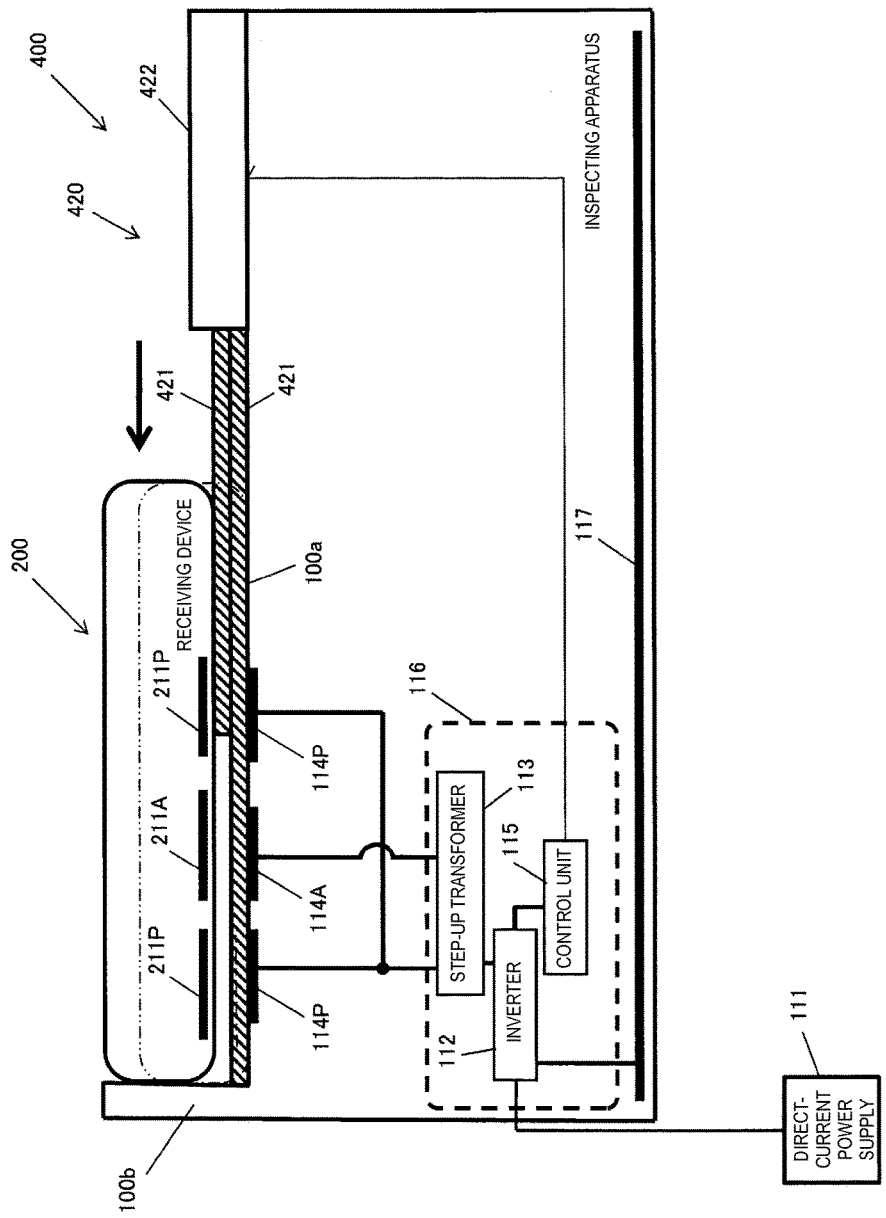
FIG. 7B illustrates a state of testing performed by the inspecting apparatus according to the third embodiment.

An inspecting apparatus according to a third embodiment will be described with reference to FIGS. 7A and 7B. FIG. 7A illustrates a general structure of the inspecting apparatus according to the third embodiment. FIG. 7B illustrates a state of testing performed by the inspecting apparatus according to the third embodiment. The inspecting apparatus of the present embodiment differs from those of the first and second embodiments in the structure of the coupling capacitance varying unit.

A coupling capacitance varying unit 420 of an inspecting apparatus 400 according to the present embodiment includes a movable body 421 and a driving part 422.

The movable body 421 is movably disposed on the loading surface 100a. The movable body 421 is in the shape of a sheet having a predetermined thickness.

The driving part 422 is capable of moving the movable body 421 toward the receiving device 200 in a direction parallel to the loading surface 100a. The driving part 422 includes, for example, a motor and a connection for transmitting the power of the motor to the movable body 421. The drive of the motor of the driving part 422 is controlled on the basis of a drive signal from the control unit 115.

The driving part 422 moves the movable body 421 in a horizontal direction between a reference position A shown in FIG. 7A and an inspection position B shown in FIG. 7B. At the inspection position, as illustrated in FIG. 7B, a leading end of the movable body 421 is inserted into the space between the receiving device 200 and the loading surface 100a of the inspecting apparatus 400. This causes the receiving device 200 to be raised substantially parallel to the loading surface 100a, and widens the distance from the transmitting-side passive electrode 114P and the transmitting-side active electrode 114A of the inspecting apparatus 400 to the receiving-side passive electrode 211P and the receiving-side active electrode 211A of the receiving device 200. Thus, the transmission/reception coupling capacitance decreases, and the inspecting apparatus 400 increases the alternating-current voltage value ACV. This makes it possible to perform an activation test on the overvoltage protection circuit 213.

Thus, as in the first embodiment, an activation test on the overvoltage protection circuit 213 can be easily performed in the receiving device 200 of the noncontact power transfer system.

Fourth Embodiment

An inspecting apparatus according to a fourth embodiment will be described with reference to FIG. 8. FIG. 8 illustrates a general structure of the inspecting apparatus according to the fourth embodiment. In the inspecting apparatus of the present embodiment, the coupling capacitance varying unit includes variable capacitance elements (variable reactance elements).

Specifically, a coupling capacitance varying unit 520 includes variable capacitance elements 521 between the transmitting-side passive electrode 114P and the transmitting-side active electrode 114A and the step-up transformer 113, and also between the transmitting-side passive electrode 114P and the reference electrode 117 of an inspecting apparatus 500.

The control unit 115 varies the capacitance of the variable capacitance elements 521 during inspection. Specifically, instead of moving the movable body (increasing the interelectrode distance) in step S1 of FIG. 3, the control unit 115 controls each of the variable capacitance elements 521 such that their combined capacitance becomes a first predetermined capacitance. The combined capacitance of the first predetermined capacitance and the transmission/reception coupling capacitance obtained when the receiving device 200 is placed on the inspecting apparatus 500, as illustrated in FIG. 8, is substantially equal to the transmission/reception coupling capacitance obtained when the receiving device 200 is raised as illustrated in FIG. 2B of the first embodiment.

Also, instead of moving the movable body 121 (decreasing the interelectrode distance) in step S6 of FIG. 3, the control unit 115 controls each of the variable capacitance elements 521 such that they are substantially short-circuited. That is, the control unit 115 controls each of the variable capacitance elements 521 such that the combined capacitance of a second predetermined capacitance and the transmission/reception coupling capacitance obtained when the receiving device 200 is placed on the inspecting apparatus 500, as illustrated in FIG. 8, is substantially equal to the transmission/reception coupling capacitance obtained when the receiving device 200 is placed on the loading surface 100a as illustrated in FIG. 2A of the first embodiment.

Also, instead of moving the movable body 121 (increasing the interelectrode distance) in step S1 of FIG. 3, the control unit 115 controls each of the variable capacitance elements such that its capacitance becomes the first predetermined capacitance.

By the control operations described above, the inspecting apparatus 500 for the overvoltage protection circuit 213 of the receiving device 200 can be configured without providing, for example, the movable body 121 and the driving part 122.

Thus, as in the first embodiment, an activation test on the overvoltage protection circuit 213 can be easily performed in the receiving device 200 of the noncontact power transfer system.

Fifth Embodiment

An inspecting apparatus according to a fifth embodiment will be described with reference to FIG. 9. FIG. 9 illustrates a general structure of the inspecting apparatus according to the fifth embodiment. In the first to fourth embodiments, the control unit of the inspecting apparatus performs all control operations for power transmission and inspection. Alternatively, as in the present embodiment, an inspection control circuit and the like may be added to share the control operations between the inspection control circuit and the control unit. Although an inspecting apparatus 600 of the present embodiment illustrated in FIG. 9 includes the coupling capacitance varying unit 120 having the same structure as that in the first embodiment, the inspecting apparatus 600 may include a coupling capacitance varying unit which is the same as any of those in the second to fourth embodiments.

Specifically, the inspecting apparatus 600 of the present embodiment is obtained by adding an inspection control circuit 601, a measuring circuit 602, and a computer 603 to the structure of the first embodiment.

The measuring circuit 602 measures the direct-current voltage value DCV and the direct current value DCI of direct-current power output from the direct-current power supply 111. Although the control unit 115 is capable of measuring the direct-current voltage value DCV and the direct current value DCI, the measuring circuit 602 is provided in the present embodiment for better measurement accuracy. The measuring circuit 602 is capable of measuring the direct-current voltage value DCV and the direct current value DCI with higher measurement accuracy than the control unit 115.

The inspection control circuit 601 shares execution of some of the functions of the control unit 115 in the first embodiment. For example, the inspection control circuit 601 receives the direct-current voltage value DCV, the direct current value DCI, and the alternating-current voltage value ACV measured by the control unit 115, and the direct-current voltage value DCV and the direct current value DCI measured by the measuring circuit 602, and executes some of the steps in the flowchart of FIG. 3 on the basis of these measured values. For each requested function, the inspection control circuit 601 selects and uses values measured either by the control unit 115 or the measuring circuit 602. The setting of which measured values to use is made in advance for each function. The determination of which of the functions (steps) of the control unit 115 are to be shared may be appropriately made by taking into account the required inspection accuracy or the like.

The computer 603 includes a CPU and a storage unit. The computer 603 acquires data related to the result of inspection from the inspection control circuit 601, and stores the acquired data in the storage unit. The computer 603 stores inspection conditions corresponding to various receiving devices 200. Examples of the inspection conditions include the amount of driving by the driving part and thresholds for determinations.

For execution of inspection, the inspection control circuit 601 reads, from the storage unit of the computer 603, data related to inspection conditions for the receiving device 200 to be inspected, and executes the inspection on the basis of the inspection conditions described in the read data.

Thus, as in the first embodiment, an activation test on the overvoltage protection circuit 213 can be easily performed in the receiving device 200 of the noncontact power transfer system.

In particular, in the present embodiment, tests corresponding to various receiving devices 200 can be performed by the single inspecting apparatus 600. With the measuring circuit 602 having measurement accuracy higher than the control unit 115, it is possible to achieve higher inspection accuracy.

Other Embodiments for Inspecting Receiving Device

Although the receiving device 200 is raised at its one end in the first and second embodiments, the receiving device 200 may be raised at its both ends by the movable body and the driving part provided at both ends.

In the embodiments described above, both the first coupling capacitance between the transmitting-side active electrode 114A and the receiving-side active electrode 211A and the second coupling capacitance between the transmitting-side passive electrode 114P and the receiving-side passive electrode 211P are varied. However, in the fourth embodiment, only one of the first and second coupling capacitances can be varied. Even in the case of varying only one of the first and second coupling capacitances, it is still possible to reproduce the conditions similar to those under which the receiving device 200 is removed from the transmitting device.

In the embodiments described above, the transmitting device indirectly monitors and determines the output voltage of the receiving device. Alternatively, the inspecting apparatus and the receiving device may be connected via wires so that the output voltage is directly monitored and determined by the receiving device, or so that the output voltage is directly monitored by the receiving device and the resulting information is transmitted to the inspecting apparatus and determined by the transmitting device.

In direct monitoring by the receiving device, the output current to the load of the receiving module may be monitored.

Sixth Embodiment

The inspecting apparatus for inspecting the receiving device has been described in each of the embodiments described above. The technical idea of the inspecting apparatus according to each of the embodiments described above is applicable to inspecting apparatuses for inspecting a transmitting device. For example, the technical idea described above is applicable to inspecting apparatuses for pre-shipment inspection of a transmitting device (charging cradle) that charges a receiving device, such as a smartphone or a tablet, by wirelessly transferring power thereto. In this case, the inspecting apparatus is provided as an article separate from the transmitting device (charging cradle). Hereinafter, an embodiment of such an inspecting apparatus for inspecting a transmitting device will be described.

1. Configuration

FIG. 10 illustrates a general structure of an inspecting apparatus according to a sixth embodiment.

In the present embodiment, as a receiving device 200A placed on a transmitting device 110A to be inspected by an inspecting apparatus 700, a reference receiving device that satisfies predetermined conditions for being a receiving device for inspection is used. For testing an overcurrent protection function of the transmitting device 110A described below, it is desirable to set a high threshold for an overvoltage protection circuit of the receiving device 200A for inspection so as to prevent early activation of the overvoltage protection circuit of the receiving device 200A for inspection.

The transmitting device 110A to be inspected includes the inverter 112, the step-up transformer 113, the transmitting-side passive electrode 114P, the transmitting-side active electrode 114A, and a control unit 115A. The inverter 112, the step-up transformer 113, and the control unit 115A form a transmitting module 116A. The configurations of the inverter 112, the step-up transformer 113, the transmitting-side passive electrode 114P, and the transmitting-side active electrode 114A are the same as those in the first embodiment.

The control unit 115A controls the overall operation of the transmitting device 110A. The control unit 115A stops the power transfer operation of the transmitting device 110A when an output current value of the inverter 112 becomes greater than or equal to a predetermined value. For example, if a short circuit occurs in the step-up transformer 113, the transmitting-side passive electrode 114P, or the transmitting-side active electrode 114A on the secondary side of the inverter 112, an overcurrent may flow on the secondary side of the inverter 112. Even if no short circuit occurs, for example, if the transmitting-side passive electrode 114P and the transmitting-side active electrode 114A are brought close to each other for some reason, the capacitance between these electrodes may increase and this may result in a flow of current larger than usual on the secondary side of the inverter 112. In the event of such conditions, the control unit 115A stops the operation of the inverter 112 to stop the power transfer operation of the transmitting device 110A. Upon receipt of a control signal from an inspection control circuit 601A of the inspecting apparatus 700, the control unit 115A controls the operation of the transmitting device 110A in accordance with the type of the control signal. For example, the inspection control circuit 601A transmits a control signal for executing the operation according to the flowchart of FIG. 3 to the inspecting apparatus 700, which performs an operation corresponding to the control signal received from the inspection control circuit 601A.

The control unit 115A measures the direct-current voltage value DCV and the direct current value DCI of direct-current power output from the direct-current power supply 111, and outputs the measured values to the inspection control circuit 601A.

The inspecting apparatus 700 according to the present embodiment includes the coupling capacitance varying unit 120, the measuring circuit 602, the inspection control circuit 601A, and a computer 603A.

The coupling capacitance varying unit 120 has the same configuration as the coupling capacitance varying unit of the first embodiment.

The measuring circuit 602 measures, as in the fifth embodiment, the direct-current voltage value DCV and the direct current value DCI of direct-current power output from the direct-current power supply 111. Although the control unit 115A is capable of measuring the direct-current voltage value DCV and the direct current value DCI, the measuring circuit 602 is provided in the present embodiment for better measurement accuracy. The measuring circuit 602 is capable of measuring the direct-current voltage value DCV and the direct current value DCI with higher measurement accuracy than the control unit 115A.

The inspection control circuit 601A receives the direct-current voltage value DCV, the direct current value DCI, and the alternating-current voltage value ACV measured by the control unit 115A, and the direct-current voltage value DCV and the direct current value DCI measured by the measuring circuit 602. On the basis of these measured values, the inspection control circuit 601A executes some of the steps in the flowchart of FIG. 3, or outputs a control signal for executing the operations corresponding to the steps to the control unit 115A of the transmitting device 110A. For each requested function, the inspection control circuit 601A selects and uses values measured either by the control unit 115A or the measuring circuit 602. The setting of which measured values to use is made in advance for each function. The determination of which of the functions (steps) of the control unit 115A are to be shared may be appropriately made by taking into account the required inspection accuracy or the like.

The computer 603A includes a CPU and a storage unit. The computer 603A acquires data related to the result of inspection from the inspection control circuit 601A, and stores the acquired data in the storage unit. The computer 603A stores inspection conditions corresponding to various transmitting devices. Examples of the inspection conditions include the amount of driving by the driving part and thresholds for determinations.

For execution of inspection, the inspection control circuit 601A reads, from the storage unit of the computer 603A, data related to inspection conditions for the transmitting device to be inspected, and executes the inspection on the basis of the inspection conditions described in the read data.

2. Inspecting Operation

An inspecting operation of the inspecting apparatus 700 according to the present embodiment will be described. This inspecting operation is performed on the basis of the flowchart of FIG. 3. Differences from the first embodiment are a control entity that controls the inspecting operation and a device to be inspected. The differences will be mainly described.

The inspection control circuit 601A outputs a drive signal to the driving part 122 to move the movable body 121 toward the receiving device 200A by a predetermined distance (S1).

The inspection control circuit 601A outputs a control signal to the control unit 115A of the transmitting device 110A to execute the operations of steps S2 and S3. Upon receipt of the control signal, the control unit 115A of the transmitting device 110A activates the inverter 112 (S2) and performs a preparation operation for power transfer (S3). For example, as a preparation operation for power transfer, the control unit 115A measures, while varying the transmission frequency, an output impedance of the transmitting device 110A in a state where power smaller than that during normal power transfer is being output, and determines a transmission frequency which allows most efficient power transfer on the basis of the measured output impedance. The control unit 115A outputs the measured output impedance to the inspection control circuit 601A.

On the basis of the value of the output impedance received from the control unit 115A, the inspection control circuit 601A determines whether power transfer is possible (S4). In the present embodiment, the determination of whether power transfer is possible is made on the basis of whether the output impedance at the determined transmission frequency is greater than the predetermined impedance.

If the output impedance at the determined transmission frequency is less than or equal to the predetermined impedance, the inspection control circuit 601A determines that power transfer is possible, that is, something is wrong with the transmitting device 110A (S5).

On the other hand, if the output impedance at the determined transmission frequency is greater than the predetermined impedance, the inspection control circuit 601A determines that the condition is not suitable for power transfer, that is, nothing is wrong with the transmitting device 110A. Then, the inspection control circuit 601A outputs a drive signal to the driving part 122 to move the movable body 121 back to the reference position (S6).

The inspection control circuit 601A outputs a control signal to the control unit 115A of the transmitting device 110A to execute the operation of step S6. Upon receipt of the control signal, the control unit 115A of the transmitting device 110A performs a preparation operation for power transfer in the same manner as in step S3 (S7).

On the basis of the value of the output impedance received from the control unit 115A, the inspection control circuit 601A determines whether power transfer is possible (S8). Since the receiving device 200A is placed on the loading surface 100a of the transmitting device 110A, the control unit 115A will normally determine in step S8 that power transfer is possible. However, the operation in step S8 is intended to determine an abnormal state where transfer is not possible. On the other hand, in step S3, where the receiving device 200A is spaced from the loading surface 100a of the transmitting device 110A, the control unit 115A will normally not determine that power transfer is possible. However, the operation in step S3 is intended to determine an abnormal state where power transfer is possible. Since the receiving device 200A is placed on the loading surface 100a of the transmitting device 110A during the execution of step S8, the output impedance at the determined transmission frequency should be smaller than the predetermined impedance. Therefore, in the present embodiment, the determination of whether power transfer is possible is made on the basis of whether the output impedance at the determined transmission frequency is smaller than the predetermined impedance.

Then, if the output impedance at the determined transmission frequency is greater than or equal to the predetermined impedance, the inspection control circuit 601A determines that power transfer is not possible, that is, something is wrong with the transmitting device 110A (S9).

On the other hand, if the output impedance at the determined transmission frequency is smaller than the predetermined impedance, the inspection control circuit 601A determines that power transfer is possible, that is, nothing is wrong with the transmitting device 110A. The inspection control circuit 601A outputs a control signal to the control unit 115A of the transmitting device 110A to execute the operation in step S10. Upon receipt of the control signal, the control unit 115A starts the operation of power transfer to the receiving device 200A (S10).

On the basis of a signal from the control unit 115A, the inspection control circuit 601A measures the direct current value DCI and the direct-current voltage value DCV of direct-current power output from the direct-current power supply 111 and the voltage value ACV of the alternating-current voltage applied to the transmitting-side active electrode 114A (S11). The direct current value DCI and the direct-current voltage value DCV of direct-current power output from the direct-current power supply 111 may be measured by the measuring circuit 602.

On the basis of the result of the measurement in step S11, the inspection control circuit 601A determines whether the power transfer is being performed properly (S12).

If determining that the power transfer is not being performed properly, the inspection control circuit 601A determines that something is wrong with the transmitting device 110A (S13).

On the other hand, if determining that the power transfer is being performed properly, the inspection control circuit 601A outputs a drive signal to the driving part 122 to move the movable body 121 to the inspection position so that the receiving device 200A is raised by a predetermined height at one end thereof (S14).

In this state, the inspection control circuit 601A determines whether the power transfer is continuing (S15). Specifically, the inspection control circuit 601A determines a threshold voltage on the basis of the direct current value DCI measured after the execution of step S14 and the characteristic shown in FIG. 4. The inspection control circuit 601A determines whether the alternating-current voltage value ACV measured after the execution of step S14 is greater than or equal to the determined threshold voltage. If the measured alternating-current voltage value ACV is greater than or equal to the threshold voltage, the inspection control circuit 601A determines that the power transfer is continuing, that is, something is wrong with the transmitting device 110A (S16). It is thus determined that something is wrong with the protection function against overcurrent (overvoltage) of the transmitting device 110A.

On the other hand, if the measured alternating-current voltage value ACV is less than the threshold voltage, the inspection control circuit 601A determines that the power transfer has stopped, that is, nothing is wrong with the transmitting device 110A (S17).

As described above, in the present embodiment, an operation test can be performed on the transmitting device instead of the receiving device. That is, for pre-shipment inspection of the transmitting device to be sold alone or in combination with the receiving device, a receiving device serving as a reference is prepared. Then, an operation test on the transmitting device can be performed in which, for example, the inspection control circuit and the measuring circuit detect whether the transmitting device properly stops power transfer after removal of the reference receiving device.

In the present embodiment, tests corresponding to various transmitting devices can be performed by the single inspecting apparatus 700. With the measuring circuit 602 having measurement accuracy higher than the control unit 115A of the transmitting device 110A, it is possible to achieve higher inspection accuracy. A threshold for ACV on the side of the transmitting device 110A needs to be set such that a problem with the receiving device can be accurately detected. Therefore, for example, parameters for stopping the power transfer because of the problem with the transmitting device itself may be set more loosely than set values for normal products.

Seventh Embodiment

Figure 11:
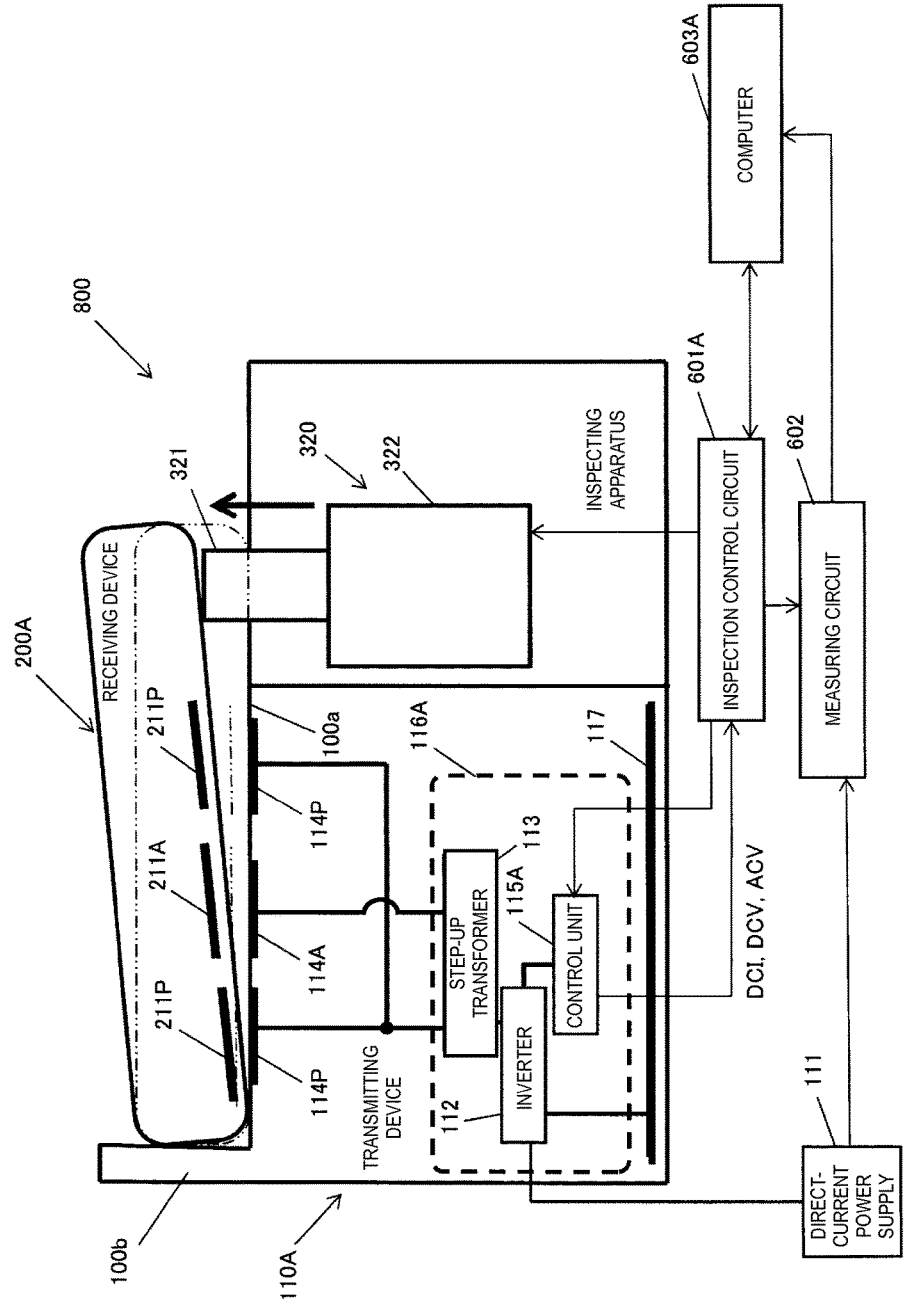
FIG. 11 illustrates a general structure of an inspecting apparatus according to a seventh embodiment.

FIG. 11 illustrates a general structure of an inspecting apparatus according to a seventh embodiment. As in the sixth embodiment, the inspecting apparatus according to the present embodiment is an inspecting apparatus for inspecting a transmitting device.

An inspecting apparatus 800 according to the present embodiment differs from the inspecting apparatus of the sixth embodiment in the configuration of the coupling capacitance varying unit. The configuration of the coupling capacitance varying unit 320 is the same as that of the coupling capacitance varying unit 320 of the second embodiment. Except for the coupling capacitance varying unit 320, the configuration of the inspecting apparatus 800 is the same as the sixth embodiment.

The inspecting apparatus 800 of the present embodiment can achieve the same effect as the sixth embodiment when the coupling capacitance varying unit 320 is configured in the same manner as the second embodiment.

Eighth Embodiment

Figure 12:
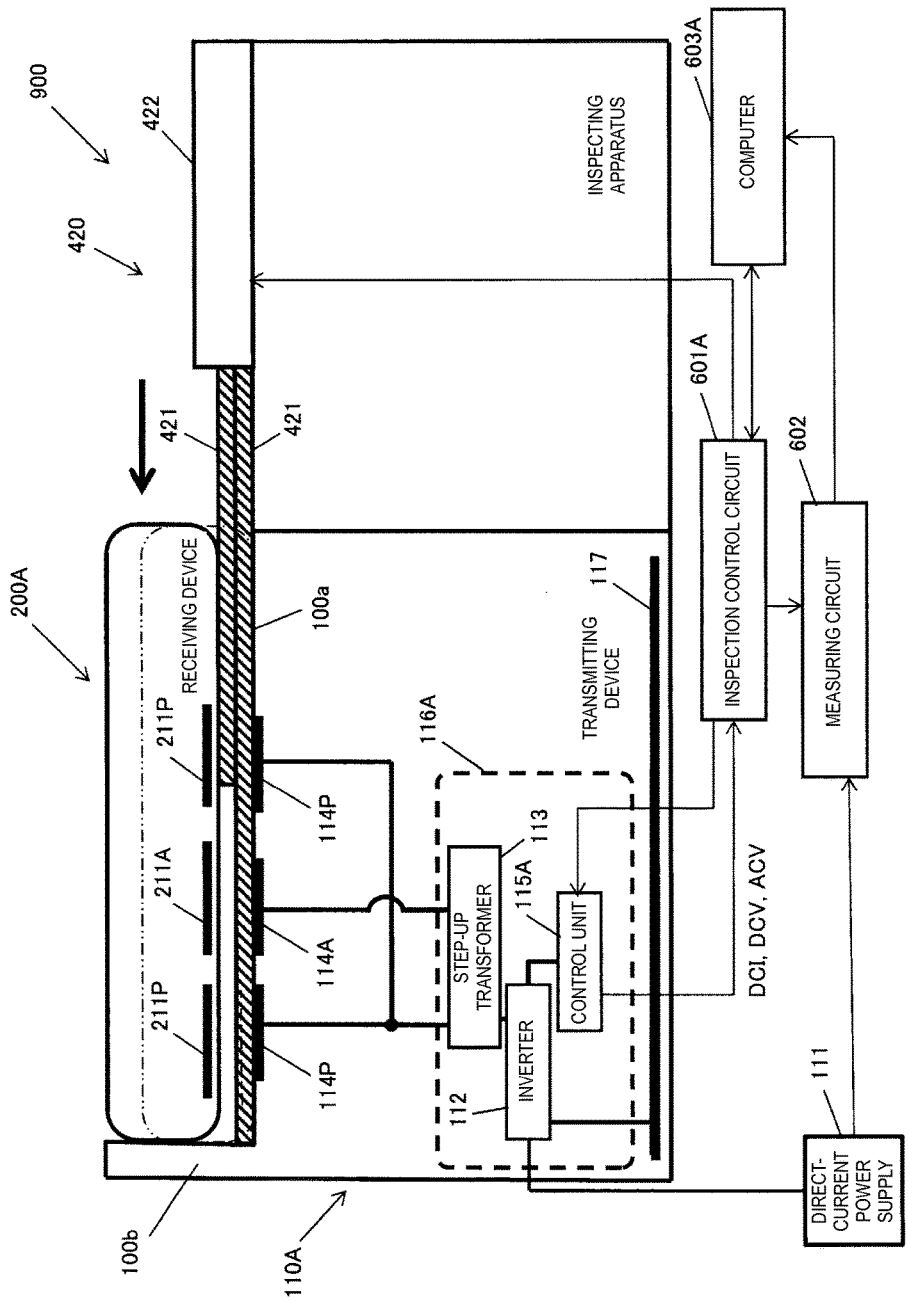
FIG. 12 illustrates a general structure of an inspecting apparatus according to an eighth embodiment.

FIG. 12 illustrates a general structure of an inspecting apparatus according to an eighth embodiment. As in the sixth embodiment, the inspecting apparatus according to the present embodiment is an inspecting apparatus for inspecting a transmitting device.

An inspecting apparatus 900 according to the present embodiment differs from the inspecting apparatus of the sixth embodiment in the configuration of the coupling capacitance varying unit. The configuration of the coupling capacitance varying unit 420 is the same as that of the coupling capacitance varying unit 420 of the third embodiment. Except for the coupling capacitance varying unit 420, the configuration of the inspecting apparatus 900 is the same as the sixth embodiment.

The inspecting apparatus 900 of the present embodiment can achieve the same effect as the sixth embodiment when the coupling capacitance varying unit 420 is configured in the same manner as the third embodiment.

Ninth Embodiment

Figure 13:
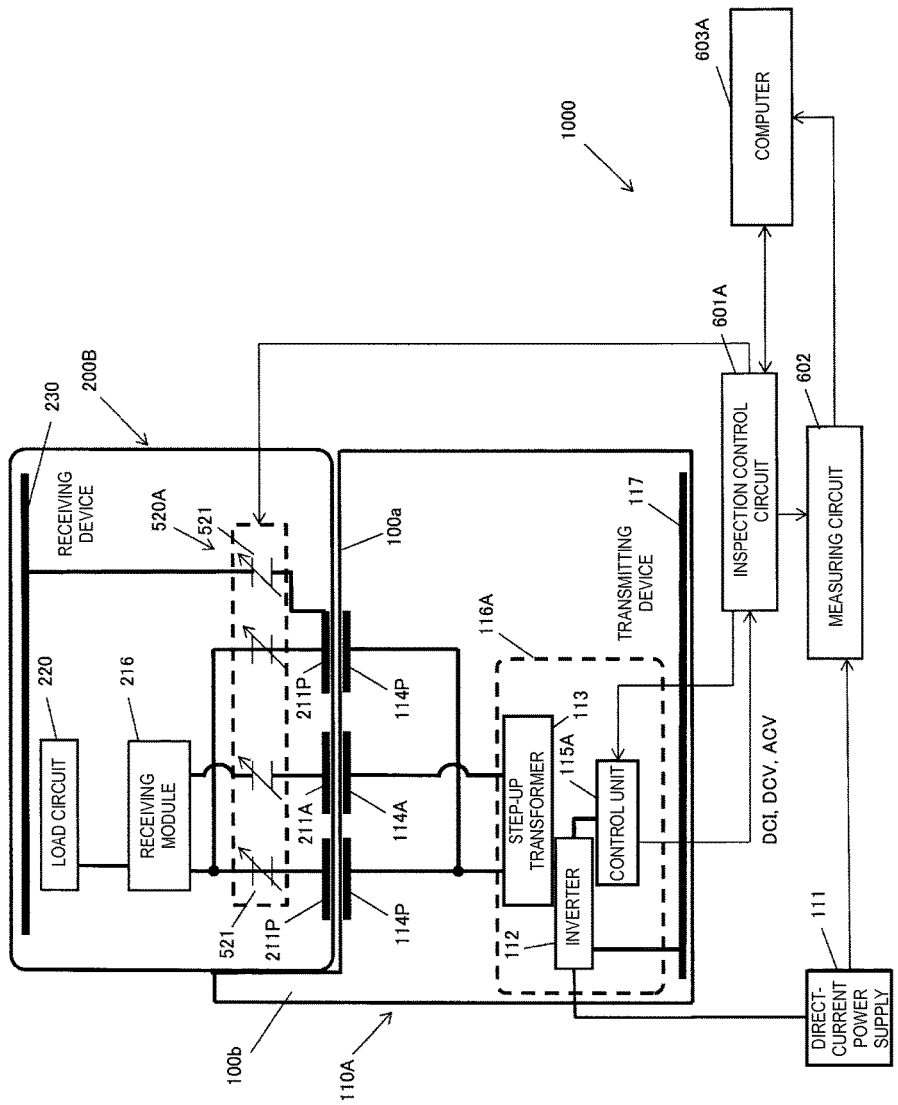
FIG. 13 illustrates a general structure of an inspecting apparatus according to a ninth embodiment.

FIG. 13 illustrates a general structure of an inspecting apparatus according to an ninth embodiment. As in the sixth embodiment, the inspecting apparatus according to the present embodiment is an inspecting apparatus for inspecting a transmitting device.

In an inspecting apparatus 1000 according to the present embodiment, a receiving device 200B including a coupling capacitance varying unit 520A, which is the same as that in the fourth embodiment, is used as a reference receiving device. That is, the inspecting apparatus 1000 of the present embodiment includes the coupling capacitance varying unit 520A of the receiving device 200B as a component.

Specifically, the receiving device 200B includes the receiving-side passive electrode 211P, the receiving-side active electrode 211A, the receiving module 216, the load circuit 220, and the coupling capacitance varying unit 520A. The receiving module 216 includes the step-down transformer 212, the overvoltage protection circuit 213, the rectifying circuit 214, and the voltage adjusting circuit 215 which are the same as those in the first embodiment (see FIG. 1 for the internal configuration of the receiving module 216).

The coupling capacitance varying unit 520A includes the variable capacitance elements 521 as in the fourth embodiment. Specifically, the coupling capacitance varying unit 520A includes the variable capacitance elements 521 between the receiving-side passive electrode 211P and the receiving-side active electrode 211A and the receiving module 216 (step-down transformer 212), and also between the receiving-side passive electrode 211P and a reference electrode 230 of the receiving device 200B.

The inspection control circuit 601A varies the capacitance of the variable capacitance elements 521 during inspection. Specifically, instead of moving the movable body (increasing the interelectrode distance) in step S1 of FIG. 3, the inspection control circuit 601A controls each of the variable capacitance elements 521 such that their combined capacitance becomes a first predetermined capacitance. The combined capacitance of the first predetermined capacitance and the transmission/reception coupling capacitance obtained when the receiving device 200B is placed on the transmitting device 110A, as illustrated in FIG. 13, is substantially equal to the transmission/reception coupling capacitance obtained when the receiving device 200B is raised as illustrated in FIG. 10 of the sixth embodiment.

Also, instead of moving the movable body 121 (decreasing the interelectrode distance) in step S6 of FIG. 3, the inspection control circuit 601A controls each of the variable capacitance elements 521 such that they are substantially short-circuited. That is, the inspection control circuit 601A controls each of the variable capacitance elements 521 such that the combined capacitance of the second capacitance and the transmission/reception coupling capacitance obtained when the receiving device 200B is placed on the transmitting device 110A, as illustrated in FIG. 13, is substantially equal to the transmission/reception coupling capacitance obtained when the receiving device 200B is placed on the loading surface 100a as illustrated in FIG. 10 of the sixth embodiment.

Also, instead of moving the movable body 121 (increasing the interelectrode distance) in step S1 of FIG. 3, the inspection control circuit 601A controls each of the variable capacitance elements 521 such that its capacitance becomes the first predetermined capacitance.

By the control operations described above, an inspection, such as an operation test, on the transmitting device 110A can be easily preformed without providing the movable body 121 and the driving part 122.

Tenth Embodiment

An inspecting apparatus according to the present embodiment is an inspecting apparatus for inspecting a transmitting device. Unlike the sixth to ninth embodiments, an electronic load device, instead of a reference receiving device, is used for inspection in the present embodiment.

1. Configuration

Figure 14:
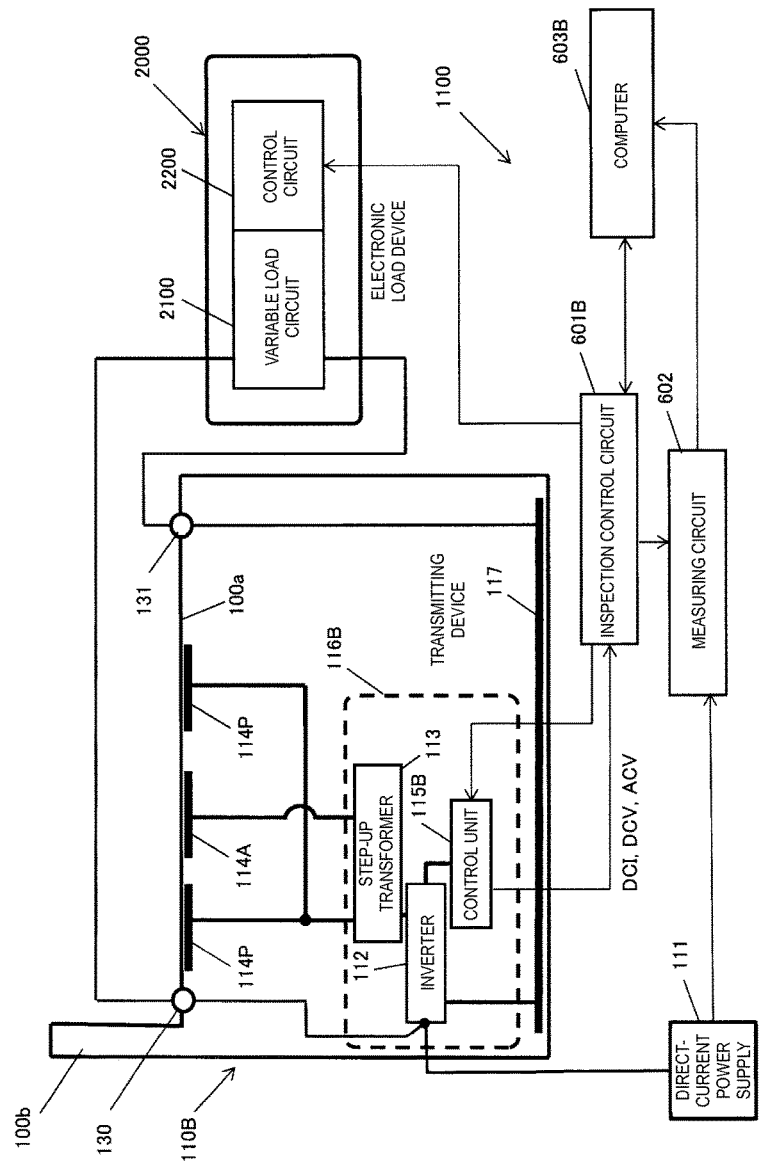
FIG. 14 illustrates a general structure of an inspecting apparatus according to a tenth embodiment.

FIG. 14 illustrates a general structure of an inspecting apparatus according to the tenth embodiment.

The transmitting device 110B to be inspected includes the inverter 112, the step-up transformer 113, the transmitting-side passive electrode 114P, the transmitting-side active electrode 114A, and a control unit 115B. The inverter 112, the step-up transformer 113, and the control unit 115B form a transmitting module 116B. The configurations of the inverter 112, the step-up transformer 113, the transmitting-side passive electrode 114P, and the transmitting-side active electrode 114A are the same as those in the first embodiment.

In addition to components of the control unit 115A of the transmitting device 110A according to the sixth to ninth embodiments, the transmitting device 110B includes terminals 130 and 131 for outputting, to an electronic load device 2000, a direct-current voltage input to the inverter 112. The locations of the terminals 130 and 131 are not limited to the upper surface of the transmitting device 110B. For example, the terminals 130 and 131 may be disposed on the side face of the transmitting device 110B.

Figure 15:
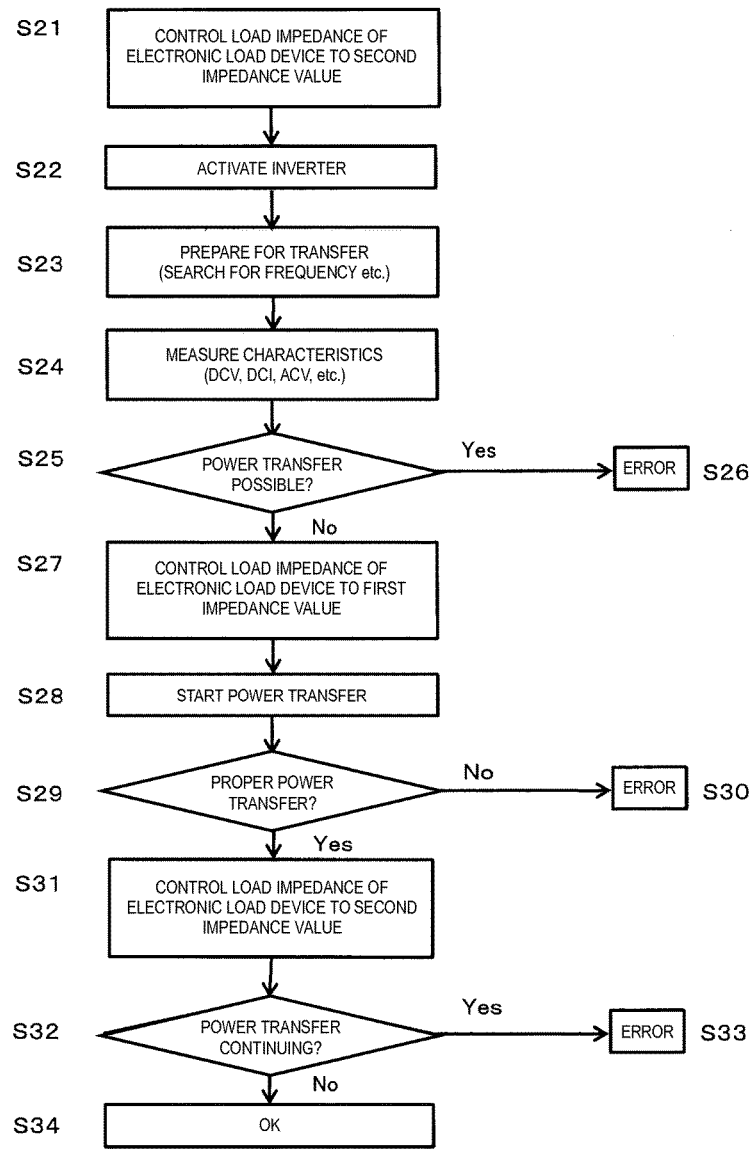
FIG. 15 is a flowchart illustrating an operation of the inspecting apparatus during inspection.

The control unit 115B controls the overall operation of the transmitting device 110B. The control unit 115B stops the power transfer operation of the transmitting device 110B when an output current value of the inverter 112 becomes greater than or equal to a predetermined value. The predetermined value for the output current value of the inverter 112 is set, for example, on the basis of an overcurrent value which should be determined to be an abnormal output of the inverter 112. Specifically, the control unit 115B determines that the output current value of the inverter 112 has become greater than or equal to the predetermined value on the basis of whether the direct current value DCI input to the inverter 112 has exceeded a predetermined threshold. If the predetermined threshold has been exceeded, the control unit 115B stops the power transfer operation of the transmitting device 110B. The predetermined threshold is set in advance to correspond to the predetermined value for the output current value of the inverter 112. For example, if a short circuit occurs in the step-up transformer 113, the transmitting-side passive electrode 114P, or the transmitting-side active electrode 114A on the secondary side of the inverter 112, an overcurrent may flow on the secondary side of the inverter 112. Even if no short circuit occurs, for example, if the transmitting-side passive electrode 114P and the transmitting-side active electrode 114A are brought closer to each other than in a normal state for some reason, the capacitance between these electrodes may increase and this may result in a flow of current larger than usual on the secondary side of the inverter 112. In the event of such conditions, the control unit 115B stops the operation of the inverter 112 to stop the power transfer operation of the transmitting device 110B. Upon receipt of a control signal from an inspection control circuit 601B of an inspecting apparatus 1100, the control unit 115B controls the operation of the transmitting device 110B in accordance with the type of the control signal. For example, the inspection control circuit 601B transmits a control signal for executing the operation according to the flowchart of FIG. 15 (described below) to the control unit 115B of the transmitting device 110B, which performs an operation corresponding to the control signal received from the inspection control circuit 601B.

The control unit 115B measures the direct-current voltage value DCV and the direct current value DCI of direct-current power output from the direct-current power supply 111 and outputs the measured values to the inspection control circuit 601B.

The inspecting apparatus 1100 according to the present embodiment includes the electronic load device 2000, the measuring circuit 602, the inspection control circuit 601B, and a computer 603B.

As in the fifth and ninth embodiments, the measuring circuit 602 measures the direct-current voltage value DCV and the direct current value DCI of direct-current power output from the direct-current power supply 111. Although the control unit 115B is capable of measuring the direct-current voltage value DCV and the direct current value DCI, the measuring circuit 602 is provided in the present embodiment for better measurement accuracy. The measuring circuit 602 is capable of measuring the direct-current voltage value DCV and the direct current value DCI with higher measurement accuracy than the control unit 115B.

The inspection control circuit 601B receives the direct-current voltage value DCV and the direct current value DCI measured by the control unit 115B, and the direct-current voltage value DCV and the direct current value DCI measured by the measuring circuit 602. On the basis of these measured values, the inspection control circuit 601B executes some of the steps in the flowchart of FIG. 15, or outputs a control signal for executing the operations corresponding to the steps to the control unit 115B of the transmitting device 110B. For each requested function, the inspection control circuit 601B selects and uses values measured either by the control unit 115B or the measuring circuit 602. The setting of which measured values to use is made in advance for each function. The determination of which of the functions (steps) of the control unit 115B are to be shared may be appropriately made by taking into account the required inspection accuracy or the like.

The computer 603B includes a CPU and a storage unit. The computer 603B acquires data related to the result of inspection from the inspection control circuit 601B, and stores the acquired data in the storage unit. The computer 603B stores inspection conditions corresponding to various transmitting devices. Examples of the inspection conditions include current values set for the electronic load device 2000 for inspection and thresholds for determinations.

For execution of inspection, the inspection control circuit 601B reads, from the storage unit of the computer 603B, data related to inspection conditions for the transmitting device to be inspected, and executes the inspection on the basis of the inspection conditions described in the read data.

In the present embodiment, as described above, the electronic load device 2000, instead of the reference receiving device, is used for the inspection. The electronic load device 2000 will be described.

The electronic load device 2000 includes a variable load circuit 2100 and a control circuit 2200.

The variable load circuit 2100 includes a variable impedance element capable of electrically controlling an impedance value. The variable load circuit 2100 is electrically connected through the terminal 130 to a supply terminal of the inverter 112, and electrically connected through the terminal 131 to the reference electrode 117. By controlling the impedance value of the variable impedance element of the variable load circuit 2100, it is possible to change the magnitude of current (load current) flowing in the variable load circuit 2100, that is, in the electronic load device 2000. As the variable impedance element, the variable load circuit 2100 includes, for example, a variable resistance element, a variable capacitance element, or a variable inductor element.

The control circuit 2200 receives a control signal from the inspection control circuit 601B, and controls the impedance value of the variable impedance element of the variable load circuit 2100 on the basis of the received control signal. Thus, the load current of the variable load circuit 2100 is controlled. For example, on the basis of the received control signal, the control circuit 2200 controls the impedance value of the variable impedance element of the variable load circuit 2100 to a first impedance value or to a second impedance value. The first impedance value is set when a control signal for performing rated power transfer (power transfer at rated power) is output to the control unit 115B of the transmitting device 110B so as to determine whether the transmitting device 110B is normal. Specifically, the first impedance value is an impedance value at which the magnitude of current output from the direct-current power supply 111 through the supply terminal of the inverter 112 to the variable load circuit 2100 during inspection is equal to the magnitude of current input from the direct-current power supply 111 to the inverter 112 while rated power transfer to the receiving device is being performed during normal use. The second impedance value is smaller than the first impedance value. Therefore, when the second impedance value is set, current greater than that flows when the first impedance value is set may flow from the direct-current power supply 111 to the variable load circuit 2100.

2. Inspecting Operation

An inspecting operation of the inspecting apparatus 1100 according to the present embodiment will be described. This inspecting operation is performed on the basis of the flowchart of FIG. 15. The same description as that for the flowchart of FIG. 3 will be appropriately omitted, and differences will be mainly described.

The inspection control circuit 601B outputs, to the control circuit 2200 of the electronic load device 2000, a signal for changing the impedance value of the variable impedance element of the variable load circuit 2100 to the second impedance value (S21).

The inspection control circuit 601B outputs, to the control unit 115B of the transmitting device 110B, a control signal to execute the operations in steps S22 and S23. Upon receipt of the control signal, the control unit 115B of the transmitting device 110B activates the inverter 112 (S22) and performs a preparation operation for power transfer (S23). For example, as a preparation operation for power transfer, the control unit 115B measures, while varying the transmission frequency, an output impedance of the transmitting device 110B in a state where power smaller than that during normal power transfer is being output, and determines a transmission frequency which allows most efficient power transfer on the basis of the measured output impedance.

On the basis of a signal from the control unit 115B, the inspection control circuit 601B starts to measure the direct current value DCI and the direct-current voltage value DCV of direct-current power output from the direct-current power supply 111 (S24). This measurement is performed at predetermined time intervals until the end of operations in the present flowchart. The direct current value DCI and the direct-current voltage value DCV of direct-current power output from the direct-current power supply 111 may be measured by the measuring circuit 602.

The inspection control circuit 601B determines whether power transfer is possible (S25). Specifically, the inspection control circuit 601B determines whether the direct current value DCI measured in step S24 is less than or equal to a first predetermined current value. The first predetermined current value is obtained by adding a predetermined margin set by taking into account, for example, device-to-device variation to a current value input to the inverter 112 while the transmitting device 110B is outputting power smaller than that during normal power transfer. If, in a state where the transmitting device 110B is about to output power smaller than that during normal power transfer, the direct current value DCI measured in step S24 is greater than the first predetermined current value, it is likely that something is wrong with the transmitting device 110B, but that the protection function of the transmitting device 110B is not working.

Therefore, if the measured direct current value DCI is greater than the first predetermined current value, the inspection control circuit 601B determines that something is wrong with the transmitting device 110B (S26).

On the other hand, if the measured direct current value DCI is less than or equal to the first predetermined current value, the inspection control circuit 601B determines that the transmitting device 110B is not ready for power transfer, that is, nothing is wrong with the transmitting device 110B. Next, the inspection control circuit 601B outputs, to the control circuit 2200 of the electronic load device 2000, a signal for changing the impedance value of the variable impedance element to the first impedance value (S27).

The inspection control circuit 601B outputs, to the control unit 115B of the transmitting device 110B, a control signal for starting a power transfer operation. Upon receipt of the control signal, the control unit 115B starts the operation of power transfer to the electronic load device 2000 (S28).

On the basis of the result of measurement and the like, the inspection control circuit 601B determines whether the power transfer operation is being properly performed (S29). Specifically, the inspection control circuit 601B determines whether the direct current value DCI output from the direct-current power supply 111 is, for example, within ±10% of a second predetermined current value. The second predetermined current value is a current value input from the direct-current power supply 111 to the inverter 112 of the transmitting device 110B during rated power transfer from the transmitting device 110B to the receiving device in a normal use state.

If determining that the power transfer is not being properly performed, the inspection control circuit 601B determines that something is wrong with the transmitting device 110B (S30).

On the other hand, if determining that the power transfer is being properly performed, the inspection control circuit 601B outputs, to the control circuit 2200 of the electronic load device 2000, a signal for changing the impedance value of the variable impedance element to the second impedance value (S31). Unlike during the preparation operation in steps S23 to S25, the transmitting device 110B is controlled to perform power transfer. Therefore, if the impedance value of the variable impedance element is reduced to the second impedance value, the input current value of the inverter 112 may increase to a current value greater than or equal to that during rated power transfer. In this case, the protection function of the control unit 115B is activated to stop the power transfer operation of the transmitting device 110B. That is, the direct current value DCI measured after execution of S31 becomes less than or equal to a third predetermined current value, for example, substantially 0 amperes. However, if something is wrong with the protection function of the transmitting device 110B, the power transfer operation of the transmitting device 110B continues. Therefore, the direct current value DCI does not become less than or equal to the third predetermined current value (substantially 0 amperes).

In this state, the inspection control circuit 601B determines whether the power transfer is continuing (S32). Specifically, the inspection control circuit 601B determines whether the direct current value DCI measured after execution of step S31 is less than or equal to the third predetermined current value, for example, substantially 0 amperes. If the measured direct current value DCI is greater than the third predetermined current value, the inspection control circuit 601B determines that the power transfer is continuing, that is, the protection function of the transmitting device 110B is not working and something is wrong with the transmitting device 110B (S33).

On the other hand, if the measured direct current value DCI is less than or equal to the third predetermined current value, the inspection control circuit 601B determines that the power transfer is stopped, that is, the protection function of the transmitting device 110B is working properly and nothing is wrong with the transmitting device 110B (S34).

As described above, in the present embodiment, an operation test on the transmitting device can be performed using the electronic load device. Thus, even when the reference receiving device cannot be prepared, an operation test on the transmitting device can be performed. Also, unlike the embodiments described above, there is no need to provide a driving member for moving the receiving device, and this can simplify the structure of the inspecting apparatus.

Also in the present embodiment, which does not require manual replacement of the receiving device, it is possible to reduce time and effort for inspection.

The electronic load device 2000 may be controlled on the basis of the alternating-current voltage value ACV. However, controlling the electronic load device 2000 using the alternating-current voltage value ACV requires a rectifying unit or the like, and this makes the configuration of the transmitting device 110B complicated. The present embodiment can simplify the configuration of the transmitting device 110B.

3. Summary

The inspecting apparatus 1100 of the present embodiment is an apparatus for inspecting the transmitting device 110B that includes the transmitting-side active electrode 114A and the transmitting-side passive electrode 114P (the first electrode and the second electrode), and the inverter 112 (alternating-current voltage generating circuit) configured to generate an alternating-current voltage by converting a direct current input from the direct-current power supply 111 and apply the alternating-current voltage between the transmitting-side active electrode 114A and the transmitting-side passive electrode 114P through the step-up transformer 113. The transmitting device 110B is configured to transfer electric power from the transmitting-side active electrode 114A and the transmitting-side passive electrode 114P (the first electrode and the second electrode) to the receiving device in a noncontact manner.

The inspecting apparatus 1100 includes the variable load circuit 2100 connected to an input of the inverter 112 (alternating-current voltage generating circuit) and capable of controlling a load impedance, the inspection control circuit 601B and the control circuit 2200 (load impedance control unit) configured to vary the load impedance of the variable load circuit 2100, and the control unit 115B (monitoring unit) configured to monitor a direct current input to the inverter 112 (alternating-current voltage generating circuit).

In the present embodiment, the determination in step S25 as to whether power transfer is possible is made on the basis of the measured direct current value DCI. Alternatively, the determination may be made on the basis of the impedance, as in the embodiments described above. When the receiving device or the reference receiving device is not placed on the transmitting device 110B, the measured impedance is greater than the predetermined impedance if nothing is wrong with the transmitting device 110B. However, if something is wrong with the transmitting device 110B, the output impedance at the determined transmission frequency may be less than or equal to the predetermined impedance. Therefore, the determination of whether power transfer is possible can be made on the basis of the impedance. For the determination based on the impedance, the setting of the electronic load device in step S21 may be the same as that in step S27.

REFERENCE SIGNS LIST 100, 200, 300, 400, 500, 600, 700, 800, 900, 1000, 1100: inspecting apparatus
110: transmitting unit
110A, 110B: transmitting device
111: direct-current power supply
112: inverter
113: step-up transformer
114P: transmitting-side passive electrode (second electrode)
114A: transmitting-side active electrode (first electrode)
115, 115A, 115B: control unit
116, 116A, 116B: transmitting module
117: reference electrode
120: coupling capacitance varying unit
121, 321, 421: movable body 122, 322, 422: driving part
200, 200A, 200B: receiving device
211P: receiving-side passive electrode (fourth electrode)
211A: receiving-side active electrode (third electrode)
212: step-down transformer
213: overvoltage protection circuit
214: rectifying circuit
215: voltage adjusting circuit
216: receiving module
220: load circuit
230: reference electrode
520, 520A: coupling capacitance varying unit
521: variable capacitance element
601, 601A, 601B: inspection control circuit
602: measuring circuit
603, 603A, 603B: computer

The invention claimed is:

1. An inspecting apparatus for a noncontact power transfer system that includes:
   a transmitting device including:
      a first electrode and a second electrode, and
      an alternating-current voltage generating circuit configured to apply an alternating-current voltage between the first electrode and the second electrode; and
   a receiving device including:
      a third electrode and a fourth electrode,
      a receiving circuit configured to convert an alternating-current voltage generated between the third electrode and the fourth electrode to a direct-current voltage, and
      a load circuit connected to the receiving circuit,
   wherein the noncontact power transfer system is configured to transfer electric power from the transmitting device to the receiving device by a first coupling capacitance formed between the first electrode and the third electrode and a second coupling capacitance formed between the second electrode and the fourth electrode,
   the inspecting apparatus comprising:
   a coupling capacitance varying unit configured to vary at least one of the first coupling capacitance and the second coupling capacitance when the receiving device is positioned on the transmitting device; and
   a monitoring circuit configured to monitor at least one of the alternating-current voltage generated between the third electrode and the fourth electrode of the receiving device, the direct-current voltage or a load current supplied to the load circuit, the alternating-current voltage generated between the first electrode and the second electrode of the transmitting device, and an input voltage or an input current of the alternating-current voltage generating circuit.

2. The inspecting apparatus according to claim 1, wherein the monitoring circuit is integral with the transmitting device.

3. The inspecting apparatus according to claim 1, wherein the coupling capacitance varying unit includes a movable body configured to physically widen a distance between surfaces of the transmitting device and the receiving device to vary at least one of the first coupling capacitance and the second coupling capacitance.

4. The inspecting apparatus according to claim 3, wherein the movable body comprises a wedge shape configured to raise at least part of the receiving device from the transmitting device to physically widen the distance between surfaces of the respective devices.

5. The inspecting apparatus according to claim 1, wherein the monitoring circuit is further configured to measure, while varying a transmission frequency, an output impedance of the inspecting apparatus in a state where power being output is smaller than during normal power transfer operation, and a control unit of the inspecting apparatus is configured to determine a transmission frequency that allows a most efficient power transfer on a basis of the measured output impedance.

6. The inspecting apparatus according to claim 5, wherein if the output impedance at the determined transmission frequency is less than or equal to a predetermined impedance, the control unit determines that power transfer is possible and that the receiving device is operating incorrectly.

7. The inspecting apparatus according to claim 5, wherein if the output impedance at the determined transmission frequency is greater than a predetermined impedance, the control unit determines that a current state of the system is not suitable for power transfer and that the receiving device is operating correctly.

8. The inspecting apparatus according to claim 3, wherein the movable body comprises rectangular prismatic shape configured to push the receiving device away from a surface of the transmitting device.

9. The inspecting apparatus according to claim 3, wherein the movable body comprises a sheet having a predetermined thickness and a motor configured to move the sheet along the surface of the transmitting device such that the sheet is inserted between the respective devices.

10. The inspecting apparatus according to claim 1, wherein the coupling capacitance varying unit includes variable reactance elements configured to vary a coupling capacitance between the transmitting device and the receiving device.

* * * * *